(12) United States Patent
Setta et al.

(10) Patent No.: US 8,093,156 B2
(45) Date of Patent: Jan. 10, 2012

(54) METHOD FOR MANUFACTURING SEMICONDUCTOR DEVICE

(75) Inventors: Yuji Setta, Kawasaki (JP); Hajime Yamamoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 694 days.

(21) Appl. No.: 11/655,883

(22) Filed: Jan. 22, 2007

(65) Prior Publication Data

US 2007/0232077 A1      Oct. 4, 2007

(30) Foreign Application Priority Data

Mar. 28, 2006   (JP) ................................. 2006-088670

(51) Int. Cl.
*H01L 21/461* (2006.01)

(52) U.S. Cl. ............ 438/723; 438/4; 438/708; 438/780; 257/629; 257/E23.131

(58) Field of Classification Search .............. 438/4, 689, 438/694–697, 699, 702–703, 708, 723, 758, 438/778, 780; 257/629, 642, E23.131–E23.133
See application file for complete search history.

(56) References Cited

U.S. PATENT DOCUMENTS

| | | | | |
|---|---|---|---|---|
| 3,996,052 A | * | 12/1976 | Schlesinger | 430/296 |
| 5,858,620 A | * | 1/1999 | Ishibashi et al. | 430/313 |
| 6,319,853 B1 | * | 11/2001 | Ishibashi et al. | 438/780 |
| 6,579,657 B1 | * | 6/2003 | Ishibashi et al. | 430/270.1 |
| 6,641,961 B2 | * | 11/2003 | Takebe | 430/7 |
| 2002/0055070 A1 | * | 5/2002 | Uchida | 430/375 |
| 2003/0129551 A1 | * | 7/2003 | Uchida et al. | 430/542 |
| 2003/0157801 A1 | * | 8/2003 | Kozawa et al. | 438/689 |
| 2003/0170571 A1 | * | 9/2003 | Nozaki et al. | 430/314 |
| 2004/0227891 A1 | * | 11/2004 | Hirota | 349/141 |
| 2005/0164123 A1 | * | 7/2005 | Mizutani | 430/270.1 |
| 2006/0188805 A1 | * | 8/2006 | Nozaki et al. | 430/270.1 |
| 2006/0188807 A1 | * | 8/2006 | Nozaki et al. | 430/270.1 |
| 2009/0226844 A1 | | 9/2009 | Nozaki et al. | |

FOREIGN PATENT DOCUMENTS

| | | | |
|---|---|---|---|
| JP | 2001-005197 | * | 1/2001 |
| JP | 2001-5197 A | | 1/2001 |
| JP | 2006-259692 A | | 9/2006 |

OTHER PUBLICATIONS

Japanese Office Action dated Mar. 15, 2011, issued in corresponding Japanese Patent Application No. 2006-088670. (partial English translation).

* cited by examiner

*Primary Examiner* — William D Coleman
*Assistant Examiner* — Su Kim
(74) *Attorney, Agent, or Firm* — Westerman, Hattori, Daniels & Adrian, LLP

(57) ABSTRACT

To provide a method for manufacturing a semiconductor device, which the method is capable of efficient mass production of high-performance semiconductor devices by, upon manufacture of a semiconductor device, eliminating unwanted features (e.g., side lobes) created together with a resist pattern by thickening the resist pattern, to reduce the burden in designing photomasks and to increase depth of focus. The method of the present invention for manufacturing a semiconductor device includes at least: forming a resist pattern on a work surface and applying over a surface of the resist pattern a resist pattern thickening material to thereby thicken the resist pattern to eliminate an unwanted feature created together with the resist pattern.

15 Claims, 14 Drawing Sheets

METHOD FOR MANUFACTURING SEMICONDUCTOR DEVICE

CROSS-REFERENCE TO RELATED APPLICATIONS

This application is based upon and claims the benefits of the priority from the prior Japanese Patent Application No. 2006-088670 filed on Mar. 28, 2006, the entire contents of which are incorporated herein by reference.

BACKGROUND OF THE INVENTION

1. Field of the Invention

The present invention relates to a method for manufacturing a semiconductor device, which the method is capable of efficient mass production of high-performance semiconductor devices by, upon manufacture of a semiconductor device, eliminating unwanted features (e.g., side lobes) created together with a resist pattern by thickening the resist pattern, to reduce the burden in designing photomasks and to increase depth of focus.

2. Description of the Related Art

As the packing density of integrated circuits has increased in recent years, so too has the requirement for semiconductor device manufacturing equipment to achieve smaller feature size—patterns that contain lines whose width is shorter than the wavelength of exposure light employed in the manufacturing process. Along with this trend, selection of masks that can produce fine, high-resolution patterns has been conducted, and phase shift masks such as halftone masks are increasingly used in the lithography technology. The halftone masks are advantageous in improving resolution, but attention needs to be paid to the fact that they may create side lobes (sub-peaks) around a primary feature. To avoid this, a means of preventing the generation of side lobes has conventionally been provided on the mask.

An example of the foregoing means provided on the mask includes for instance a method by which the generation of side lobes is prevented by arranging Cr patterns on areas where side lobes are likely to appear. While this method can successfully prevent the generation of side lobes, it involves the use of a tri-tone mask of three layers owing to the presence of the Cr patterns arranged over the mask, placing a burden on the mask manufacture and defect inspection of masks.

In response to the demand for finer patterns, sub-resolution assist features (SRAF), which are not meant to print, are now increasingly placed over the reticle in order primarily to increase depth of focus. This SRAF technology, however, is one wherein assist features should not be printed on the surface of the resist and hence the assist features are arranged in the reticle in such size that they do not print. For this reason, there is a limitation to a further improvement of depth of focus by simply arranging relatively large SRAFs, limiting the use of larger SRAFs.

Examples of pattern layouts for semiconductor devices are those containing both repetitive patterns of a particular cell layout as typified by memory devices and a variety of randomly arranged patterns as typified by LOGIC LSIs. In many cases the memory cell layout is designed using the values that are most critical in the design rules of the corresponding generation. One of the lithography-associated resolution enhancement technologies for accomplishing the foregoing is the method that uses a phase shift mask, which is mainly used for the formation of critical layers. In this regard, masks for a metal interconnection layer (holes/trenches) are those with less features (openings).

Here, FIG. 10 shows a schematic view of a reduction projection exposure device, and FIGS. 11A to 11C show sections of general photomasks of various types that are used upon manufacture of a semiconductor device.

The reduction projection exposure device shown in FIG. 10 includes an illumination light source 101, an illumination optical system 104 for guiding light from the illumination light source 101 to a reticle 103 (photomask) placed on a reticle stage 102, and a projection optical system, which is a reduction projection lens 105. The illumination optical system 104 includes an elliptic mirror 110, a fly eye lens 111, and an aperture diaphragm 112. Light from the illumination light source 101 is guided to the reticle 103 through the illumination optical system 104, and the pattern on the reticle 103 is projected onto the resist layer on a wafer through the reduction projection lens 105. Note that in exposure devices using excimer lasers as a light source, the elliptic mirror 110 is not provided, and the illumination light source 101 serves as a laser beam source.

A mask 102 shown in FIG. 11A is a chrome mask that is also referred to as a binary mask, in which a metal masking film 122 such as Cr patterns is formed over a quarts dry plate 121. Using a reduction projection exposure device like that shown in FIG. 10, a pattern is projected onto a wafer 106 by means of light passing through Cr-free areas of the mask 120. A mask 130 shown in FIG. 11B is a halftone phase shift mask having semi-transparent metallic thin film patterns 132 made primarily of MoSi or the like provided over a quarts dry plate 131. A mask 140 shown in FIG. 11C is a Levenson phase shift mask that is identical to the chrome mask (mask 120) shown in FIG. 11A except that a trench 141 is formed that produces 180 degree phase shift in particular light passing through the quarts dry plate 121.

FIG. 12 shows a light intensity distribution obtained when the wafer is exposed using the chrome mask (mask 120) shown in FIG. 11A, and FIG. 13 shows a light intensity distribution obtained when the wafer is exposed using the halftone phase shift mask (mask 130) shown in FIG. 11B. A comparison between the light intensity distributions of FIGS. 12 and 13 reveals the differences in light intensity between different masks. Referring specifically to FIG. 13, relatively small positive peaks are seen at either side of the main positive peak for the feature 133; these small peaks are the essential cause of side lobes that are specific to halftone phase shift masks.

An example of how side lobes are created in the resist pattern will be described below. FIG. 14A is a top view of a mask pattern 150 used upon production a seal ring that is used for preventing the entry of moisture into freshly prepared LSI chips from the outside. The seal ring is also referred to as a moisture resistance ring. FIG. 14B is an image view of a resist pattern formed using the mask pattern 150. It is evident that there are side lobes S generated in areas other than the desired pattern 150 of FIG. 14B, which are not present in the mask pattern 150 of FIG. 14A. The presence of side lobes S in the resist upon exposure of the wafer results in resist pattern collapse, printing of the side lobes S after etching, etc., leading to poor device quality. Thus, there has been a need to perform a resist exposure process while avoiding the creation of such side lobes. Note that even when the primary feature has the same shape as the seal ring, similar side lobe-related problems occur. Thus it has been required to pay attention when attempting to achieve linewidths of about more than three times as large as the minimal linewidths of the corresponding generation, depending on the setting of mask bias at the standard exposure dose, though.

FIG. 15A shows an example of a mask layout for hole pattern, which is provided with SRAFs that have become frequently used. As shown in FIG. 15A, assist features 161 are arranged around a primary feature 160 in such a way that they assist exposure through the primary feature 160. It has been shown that this mask layout can increase depth of focus (DOF). The size and position of the SRAFs are determined in light of the conditions of the resist exposure process; however, it is generally important to ensure that SRAFs never print. Accordingly, although DOF is nearly proportional to the size of a SRAF, SRAFs need to be used in such a way that they never print on the resist, and therefore, there is an upper limit with respect to their operable size. If the size of SRAF exceeds this upper limit, it results in the formation of unwanted features 163, which are derived from the assist patterns 161, at positions other than the primary feature 160, as shown in FIG. 15B.

To overcome this problem the following method has been proposed, for example, which comprises the steps of printing a photomask pattern onto a photosensitive resin film, generating an acid in the photosensitive resin film, forming a crosslinkable material-containing resin film over the photosensitive resin film, and subjecting both of the resin films to heat treatment to allow the crosslinkable material to undergo crosslinking to form a reaction layer at their interface, whereby printed unwanted features are eliminated from the printed features (see Japanese Patent Application Laid-Open No. 2001-005197). This method is, however, limited to chemically amplified resists in terms of applicable resists, and thus the range of selection of available of resist materials is narrow. In addition, crosslinking reactions in the crosslinkable material-containing resin film are difficult to control. Thus, with this method, unwanted features of varying sizes cannot necessarily be removed successfully independent of the types of resist materials.

It is an object of the present invention to provide a method for manufacturing a semiconductor device, which the method is capable of efficient mass production of high-performance semiconductor devices by, upon manufacture of a semiconductor device, eliminating unwanted features (e.g., side lobes) created together with a resist pattern by thickening the resist pattern, to thereby reduce the burden in designing photomasks and to increase depth of focus.

SUMMARY OF THE INVENTION

The method of the present invention for manufacturing a semiconductor device includes: forming a resist pattern on a work surface; and applying over a surface of the resist pattern a resist pattern thickening material containing at least a resin and a compound represented by the following general formula (1) to thereby thicken the resist pattern to eliminate an unwanted feature created together with the resist pattern.

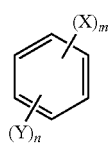

General Formula (1)

where X is a functional group represented by the following structural formula (1), Y is at least one of hydroxyl group, amino group, alkyl group-substituted amino group, alkoxy group, alkoxycarbonyl group and alkyl group, the number of substitution is an integer of 0 to 3, m is an integer of 1 or greater, and n is an integer of 0 or greater

Structural Formula (1)

where $R^1$ and $R^2$ may be identical or different and each is a hydrogen atom or substituent, Z is at least one of hydroxyl group, amino group, alkyl group-substituted amino group and alkoxy group, and the number of substitution is an integer of 0 to 3 When the resist pattern thickening material containing at least the resin and the compound represented by the general formula (1) is applied over a surface the resist pattern formed on the work surface in the above resist pattern formation step of the method of the present invention, portions of the resist pattern thickening material that are near the interface with the resist pattern infiltrate the resist pattern to interact (mix) with the resist pattern material. At this point the resist pattern thickening material has excellent compatibility with the resist pattern and thus it results in efficient formation of a surface layer (mixing layer), a layer formed as a result of interaction of the resist pattern thickening material with the resist pattern, on the surface of the resist pattern. As a result, even when resist defects (e.g., unwanted features such as side lobes, pinholes, and coating irregularities) occurred upon formation of the resist pattern, the mixing layer eliminates these resist defects. Thus it is possible to allow the generation of unwanted features of such size that they can be eliminated by means of the resist pattern thickening material, thereby reducing the burden in designing photomasks and increasing depth of focus. In addition, the resist pattern is efficiently thickened by means of the resist pattern thickening material. The resist pattern thus thickened (hereinafter referred to as "swelled" in some cases) has been uniformly thickened by means of the resist pattern thickening material (hereinafter such a resist pattern may be referred to as "thickened resist pattern" in some cases). Thus the resist space pattern (hereinafter referred to as "space pattern" in some cases) formed by the thickened resist pattern can have finer features while exceeding the exposure (resolution) limit of the light source. Note that since the resist pattern thickening material contains a compound represented by the general formula (1), it thickens the resist pattern uniformly regardless of the size or constitutional material of the resist pattern, which means that thickening capability of the resist pattern thickening material is less dependent on the size or type of the resist pattern. Furthermore, since the compound represented by the general formula (1) contains an aromatic ring, the resist pattern thickening material is excellent in terms of etching resistance. It is therefore made possible to easily form a thickened resist pattern with high resolution, which is used for the formation of a line-space pattern in an interconnection layer of LOGIC LSIs where various sizes of resist patterns are present in addition to contact hole patterns.

When the work surface is patterned by etching using the thickened resist pattern as a mask, the work surface is finely patterned with high dimension precision, allowing efficient manufacture of a high-performance, high-quality semiconductor device with a very fine pattern (e.g., an interconnection pattern) formed with high dimension precision and accuracy.

Figure 1:
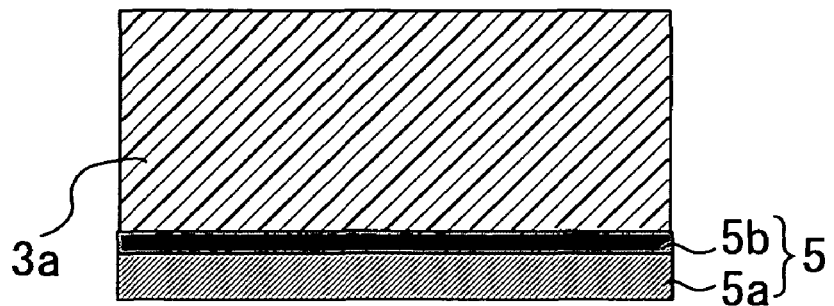
FIG. 1 is a schematic view for explaining a mechanism by which a resist pattern is thickened using a resist pattern thickening material, showing a state where a resist film has been formed.

DESCRIPTION OF THE PREFERRED EMBODIMENTS (Method for Manufacturing Semiconductor Device)

The method of the present invention for manufacturing a semiconductor device includes at least a resist pattern forming step, and preferably includes an etching step and, where necessary, additional step(s) appropriately selected.

<Resist Pattern Forming Step>

The resist pattern forming step is a step of forming a resist pattern on a work surface, and applying a resist pattern thickening material over a surface of the resist pattern to thereby thicken the resist pattern to eliminate unwanted features created together with the resist pattern.

—Work Surface—

The work surface is not particularly limited and can be appropriately selected depending on the intended purpose, and surface layers of various parts of a semiconductor device can be exemplified; specific suitable examples include substrates such as silicon wafers or the surface thereof, and low permittivity films such as various types of oxide films or the surface thereof.

—Resist Pattern—

The material of the resist pattern, i.e., the resist pattern to which the resist pattern thickening material is to be applied is not particularly limited and can be appropriately selected from known resist materials; they may be positive or negative type. Examples include g-line resists, i-line resists, KrF resists, ArF resists, $F_2$ resists, electron beam resists and the like that can be patterned using g-line, i-line, KrF excimer laser beam, ArF excimer laser beam, $F_2$ excimer laser beam, electron beam, and the like, respectively. These resists may be chemically amplified types, or non-chemically amplified types. Among them, KrF resists, ArF resists and acrylic resin-containing resists are preferable; in addition, ArF resists and acrylic resin-containing resists are more preferable, for which there is a pressing need to improve the resolution limit for finer patterning and increased throughput.

Specific examples of the materials of the resist pattern include novolac resists, PHS resists, acrylic resists, cycloolefin-maleic acid anhydrate (COMA) resists, cycloolefin resists, hybrid resists such as alicyclic acrylic-COMA copolymers. These resists may be modified by fluorine.

The size, thickness, etc., of the resist pattern are not particularly limited and can be appropriately set according to the intended purpose. In particular, the thickness is generally about 0.1 μm to 500 μm, though it can be appropriately determined depending on the work surface, etching conditions, etc.

The method of resist pattern formation is not also particularly limited, though, it preferably includes the steps of applying a resist material over a work surface, exposing the resist material using a photomask, and developing the resist material.

The method of resist material application is not particularly limited and can be appropriately selected from those known in the art; for example, spin coating is preferably used. In the case of spin coating, the rotational speed is, for example, about 100 rpm to 10,000 rpm, more preferably 800 rpm to 5,000 rpm, and the spin time is, for example, about 1 second to 10 minutes, more preferably about 1 second to 90 seconds.

Figure 11A:
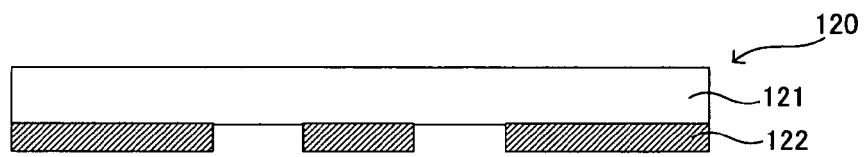
FIG. 11A is a schematic explanatory view of an example of a photomask (chrome mask).
Figure 11B:
FIG. 11B is a schematic explanatory view of an example of a photomask (halftone phase shift mask).
Figure 11C:
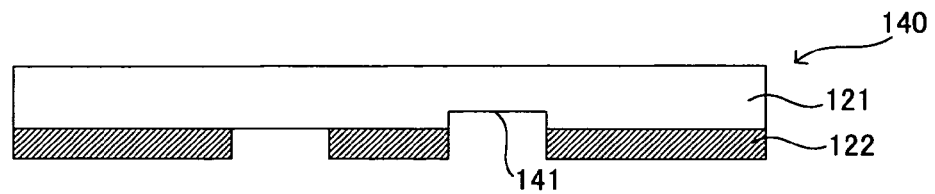
FIG. 11C is a schematic explanatory view of an example of a photomask (Levenson phase shift mask).
Figure 12:
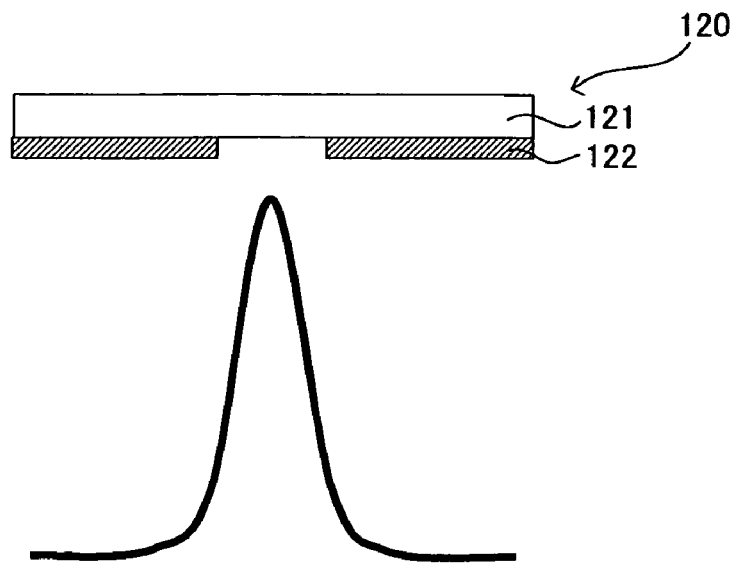
FIG. 12 is a schematic explanatory diagram of an example of a light intensity distribution obtained when exposure is conducted using the chrome mask.

The photomask is not particularly limited and can be appropriately selected depending on the intended purpose. For example, the following photomasks can be exemplified: The chrome mask 120 shown in FIG. 11A, in which a metal masking film 122 such as Cr patterns is formed over a quarts dry plate 121; the halftone phase shift mask 130 shown in FIG. 11B, which has semi-transparent metallic thin film patterns 132 made primarily of MoSi or the like provided over a quarts dry plate 131; and the Levenson phase shift mask 140 shown in FIG. 11C, which has the trench 141 that produces 180 degree phase shift in light passing through the quarts dry plate 121. Among them, when a metal interconnection layer is to be formed, masks with less features are used, and halftone phase shift masks are often used in light their capability of producing high-contrast images.

Figure 13:
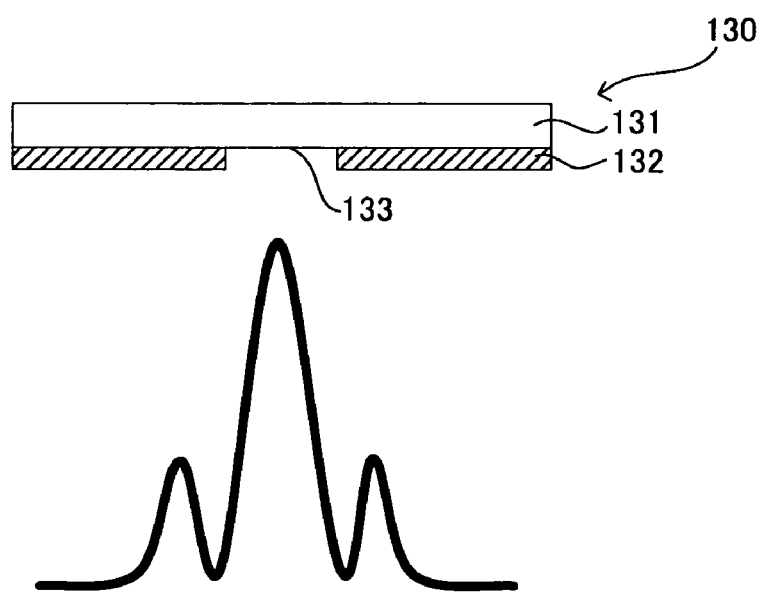
FIG. 13 is a schematic explanatory diagram of an example of a light intensity distribution obtained when exposure is conducted using the halftone phase shift mask.
Figure 14A:
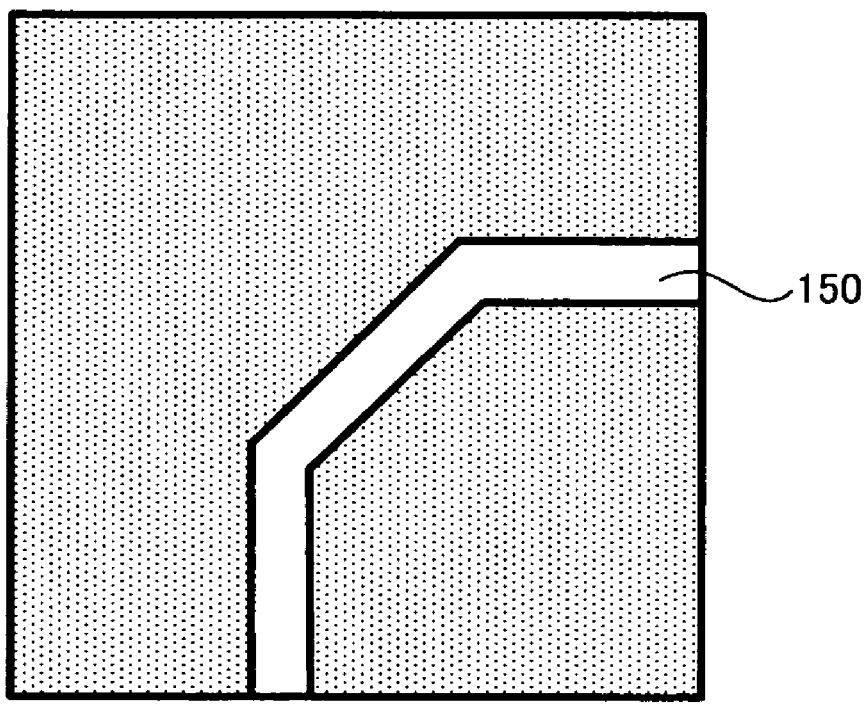
FIG. 14A is a top view of an example of a mask pattern used upon patterning for a seal ring.
Figure 14B:
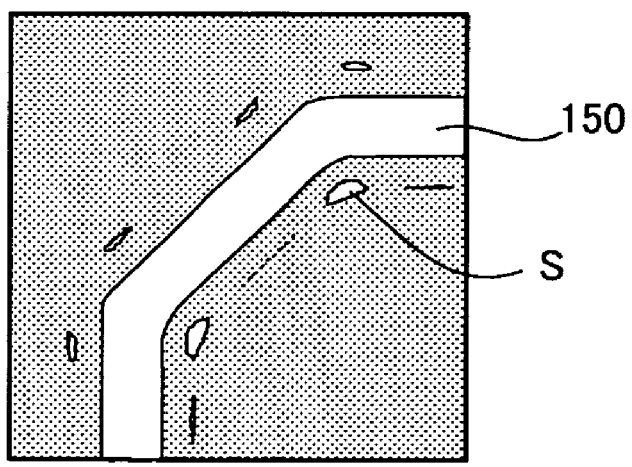
FIG. 14B is a schematic explanatory view of an example of a resist pattern prepared using the mask pattern shown in FIG. 14A, showing a state where side lobes have been formed.

FIG. 13 shows a light intensity distribution of light passing through the halftone phase shift mask 130. The halftone phase shift mask 130 uses the metal thin film 132 with a light transmittance of about 4-20% so that the phase of light passing though the quarts dry plate 131 with a light transmittance of 100% is shifted from that of light passing through the metal thin film 132. As shown in FIG. 13, in the light intensity distribution obtained with the halftone phase shift mask 130, minor peaks that derived from the light passing through the semi-transparent areas are present at either side of the main peak derived from the feature (design pattern) 133, making the main peak sharp by preventing the peak width from being broad. Thus the halftone phase shift mask 130 is advantageous in improving the optical image contrast.

In addition, small sub-peaks are also observed at positions other than the feature (design pattern) 133. The presence of too large sub-peaks results in the formation of side lobes, i.e., unwanted features; however, such unwanted features can be eliminated by the application of a later-described resist pattern thickening material over the resist pattern.

It is preferable in the present invention to form side lobes of such width that they can be eliminated by means of a resist pattern thickening material to be described later. In this case the side lobes may be formed without any hesitation because they can be subsequently eliminated by means of the resist pattern thickening material. This is advantageous because it is made possible to reduce the burden in designing photomasks and to increase depth of focus.

The shape of feature (design pattern) in the photomask is not particularly limited and can be appropriately determined depending on the intended purpose; examples include line/space patterns, hole patterns (e.g., for contact holes), and trench patterns.

Figure 15A:
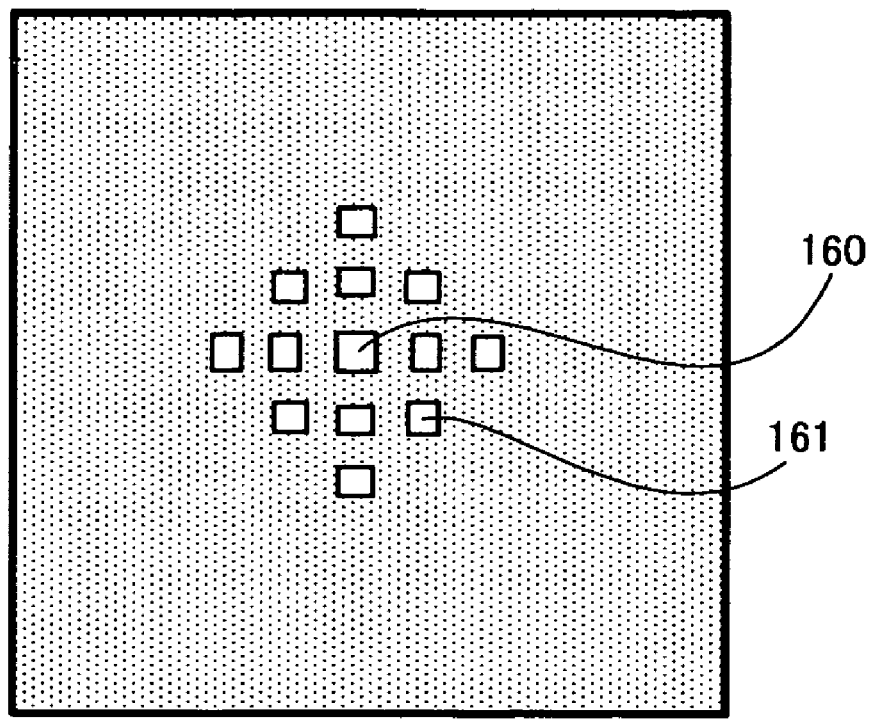
FIG. 15A is a top view of an example of a mask layout for a hole pattern, which has SRAFs arranged around a primary feature.
Figure 15B:
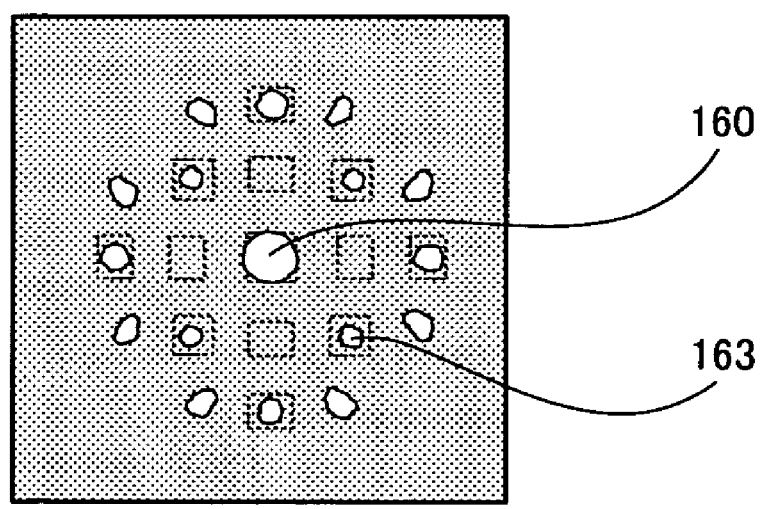
FIG. 15B is a schematic explanatory view of an example of a resist pattern prepared using a mask having the mask layout shown in FIG. 15A, showing a state where the SRAFs have been printed.

The feature or design pattern in the photomask is preferably surrounded by sub-resolution assist features (SRAFs) for increased depth of focus as shown in FIG. 15A, in which the drawing there are provided SRAFs 161 around the design pattern 160 (primary feature: hole pattern).

It is also preferable in the present invention to form unwanted features by using a photomask having assist features of such width that the unwanted features can be eliminated by means of a resist pattern thickening material to be described later. In this case the printed unwanted features derived from the assist features can be eliminated by means of the resist pattern thickening material, allowing the formation of such unwanted features without any hesitation and allowing the use of larger assist features. This is advantageous because it is made possible to reduce the burden in designing photomasks and to increase depth of focus.

The method of exposure is not particularly limited and can be appropriately determined depending on the intended purpose. For example, reduction projection exposure, immersion exposure and the like can be used.

The light source for exposure is not particularly limited and can be appropriately determined depending on the intended purpose; examples include g-line, i-line, KrF excimer laser, ArF excimer laser, and $F_2$ excimer laser.

The method of development is not particularly limited and can be appropriately selected from those known in the art. As a developer used in the development step, an alkali developer can be used, for example.

—Resist Pattern Thickening Material—

The resist pattern thickening material contains at least a resin and one compound represented by the following general formula (1) and, where necessary, further contains a surfactant, a phase transfer catalyst, a water-soluble aromatic compound, a resin where an aromatic compound is contained in its part, an organic solvent and additional ingredient(s), all of which are appropriately selected.

General Formula (1)

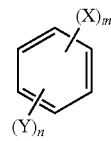

where X is a functional group represented by the following structural formula (1), Y is at least one of hydroxyl group, amino group, alkyl group-substituted amino group, alkoxy group, alkoxycarbonyl group and alkyl group, the number of substitution is an integer of 0 to 3, m is an integer of 1 or greater, and n is an integer of 0 or greater Structural Formula (1)

where $R^1$ and $R^2$ may be identical or different and each is a hydrogen atom or substituent, Z is at least one of hydroxyl group, amino group, alkyl group-substituted amino group and alkoxy group, and the number of substitution is an integer of 0 to 3

The resist pattern thickening material is preferably water soluble or alkali soluble; its water solubility is not particularly limited and can be appropriately set depending on the intended use. For example, the resist pattern thickening material preferably has a solubility of at least 0.1 g per 100 g of 25° C. water.

The alkali solubility of the resist pattern thickening material is not particularly limited and can be appropriately set depending on the intended use. For example, the resist pattern thickening material preferably has a solubility of at least 0.1 g per 100 g of 2.38% (by mass) aqueous solution of tetramethylammoniumhydroxide (TMAH) having a temperature of 25° C.

The form in which the resist pattern thickening material of the present invention is present is not particularly limited; it may be present in the form of an aqueous solution, colloidal solution or emulsion solution. Preferably, the resist pattern thickening material is present in the form of aqueous solution.

—Resin—

The resin is not particularly limited and can be appropriately selected depending on the intended use. However, water-soluble resins or alkali-soluble resins are preferably used.

For the resin, resins that contain two or more polar groups are preferable in light of their excellent water solubility or alkali solubility.

The polar group is not particularly limited and can be appropriately selected depending on the intended use; suitable examples include hydroxyl group, amino group, sulfonyl group, carbonyl group, carboxyl group and derivative groups thereof. These groups may be contained in the resin singly or in combination.

If the resin is a water-soluble resin, it preferably has a solubility of at least 0.1 g per 100 g of 25° C. water.

Examples of the water-soluble resin include polyvinyl alcohol, polyvinyl acetal, polyvinyl acetate, polyacrylic acid, polyvinylpyrrolidone, polyethyleneimine, polyethyleneoxide, styrene-maleic acid copolymers, polyvinylamine, polyallylamine, oxazoline group-containing water-soluble resins, water-soluble melamine resins, water-soluble urea resins, alkyd resins and sulfonamide resins.

If the resin is an alkali-soluble resin, it preferably has a solubility of at least 0.1 g per 100 g of 2.38% (by mass) aqueous solution of tetramethylammoniumhydroxide (TMAH) having a temperature of 25° C.

Examples of the alkali-soluble resins include novolac resins, vinylphenol resins, polyacrylic acid, polymethacrylic acid, poly-p-hydroxyphenylacrylate, poly-p-hydroxyphenylmethacrylate and copolymers thereof.

These resins may be used singly or in combination. Among these, polyvinyl alcohol, polyvinyl acetal and polyvinyl acetate are preferable. More preferably, the resin contains 5-40% by mass of polyvinyl acetal.

In the resist pattern thickening material, at least a part of the resin may contain a cyclic structure, and use of such a resin is advantageous because excellent etching resistance can be imparted to the resist pattern thickening material.

The resin, at least a part of which contains a cyclic structure, may be used singly or in combination, or may be used together with the foregoing resins.

The resin at least a part of which contains a cyclic structure is not particularly limited and can be appropriately selected; examples include polyvinyl aryl acetal resins, polyvinyl aryl ether resins, polyvinyl aryl ester resins, and derivatives thereof, and a preferable example is at least one selected from the above resins or derivatives.

Among these, those bearing an acetyl group are most preferable in view of their moderate water or alkali solubility.

The polyvinyl aryl acetal resins are not particularly limited and can be appropriately selected in accordance with the intended purpose; examples include β-resorcin acetal.

The polyvinyl aryl ether resins are not particularly limited and can be appropriately selected in accordance with the intended purpose; examples include 4-hydroxybenzyl ether.

The polyvinyl aryl ester resins are not particularly limited and can be appropriately selected in accordance with the intended purpose; examples include benzoic esters.

The production process for the polyvinyl aryl acetal resins is not particularly limited and can be appropriately selected in accordance with the intended purpose. For example, a production process that utilizes known polyvinylacetal-preparing reactions can be suitably used. For example, the production process is one in which polyvinyl alcohol is allowed to react with a stoichiometric quantity of an aldehyde in the presence of acidic catalyst. More specifically, suitable processes are those disclosed in U.S. Pat. Nos. 5,169,897, 5,262,270, JP-A No. 05-78414, etc.

The production process for the polyvinyl aryl ether resins is not particularly limited and can be appropriately selected in accordance with the intended purpose. For example, copolymerization of vinyl acetate with a corresponding vinyl aryl ether monomer, and etherification (Williamson Ether Synthesis) of polyvinyl alcohol with a halogenated alkyl group-containing aromatic compound in the presence of basic catalyst, can be exemplified. More specifically, suitable processes are those disclosed in JP-A Nos. 2001-40086, 2001-181383, 06-116194, etc.

The production process for the polyvinyl aryl ester resins is not particularly limited and can be appropriately selected in accordance with the intended purpose. For example, copolymerization of vinyl acetate with a corresponding vinyl aryl ester monomer, and etherification of polyvinyl alcohol with an aromatic carboxylic acid halide in the presence of basic catalyst, can be exemplified.

The cyclic structure in the foregoing resins is not particularly limited and can be appropriately selected in accordance with the intended purpose; it can be any of a monocyclic structure (e.g., benzene), a polycyclic structure (e.g., bisphenol) and a condensed ring structure (e.g., naphthalene). More specifically, suitable examples include aromatic compounds, alicyclic compounds and heterocyclic compounds. The resins at least a part of which contains a cyclic structure may contain one or more of these cyclic structures.

Examples of the aromatic compounds include polyfunctional polyphenol compounds, polyphenol compounds, aromatic carboxylic acid compounds, naphthalene polyfunctional alcohol compounds, benzophenone compounds, flavonoid compounds, porphin, water-soluble phenoxy resins, aromatic group-containing water-soluble dyes, derivatives thereof, and glycosides thereof. These aromatic compounds may be used singly or in combination.

Examples of the polyfunctional phenol compounds include resorcine, resorcine[4]arene, pyrogallol, gallic acid, derivatives thereof and glycosides thereof.

Examples of the polyphenol compounds include catechin, anthocyanidin such as pelargonidin-type (4'-hydroxy), cyanidin-type (3',4'-dihydroxy) and delphinidin-type (3',4',5'-trihydroxy), flavan-3,4-diol and proanthocyanidin.

Examples of the aromatic carboxylic acid compounds include salicylic acid, phthalic acid, dihydroxy benzoic acid and tannin.

Examples of the naphthalene polyfunctional alcohol compounds include naphthalene diol and naphthalene triol.

Examples of the benzophenone compounds include alizarin yellow A.

Examples of the flavonoid compounds include flavone, isoflavone, flavanol, flavonone, flavonol, flavan-3-ol, aurone, chalcone, dihydrochalcone and quercetin.

Examples of the alicyclic compounds include polycycloalkanes, cycloalkanes, condensed rings, derivatives thereof and glycosides thereof. These alicyclic compounds may be used singly or in combination.

Examples of the polycycloalkanes include adamantine, norbornene, norpinane and sterane.

Examples of the cycloalkanes include cyclopentane and cyclohexane.

Examples of the condensed rings include steroids.

Suitable examples of the heterocyclic compounds include nitrogen-containing cyclic compounds such as pyrrolidine, pyridine, imidazole, oxazole, morpholine and pyrrolidone; and oxygen-containing cyclic compounds such as furans, pyrans, and polysaccharides including 5-carbon sugars and 6-carbon sugars.

The resin, at least a part of which has a cyclic structure, preferably has at least one functional group (e.g., hydroxyl alkoxyl, carboxyl, amino, amide, alkoxycarbonyl, hydroxyalkyl, sulfonyl, acid anhydride, lactone, cyanate, isocyanate and ketone groups) or a sugar derivative in view of proper water-solubility; more preferably, the resin contains at least one functional group selected from hydroxyl group, amino group, sulfonyl group, carboxylic group, and groups derived from derivatives thereof.

The molar content of the cyclic structure in the resin is not particularly limited as long as etching resistance is not reduced, and thus can be appropriately set depending on the intended purpose. If high etching resistance is required, the molar content of the cyclic structure is preferably 5 mol % or more and, more preferably, 10 mol % or more.

Note that the molar content of such a cyclic structure in the foregoing resin can be measured for instance by NMR.

The content of the foregoing resin (i.e., resin at least a part of which contains the cyclic structure(s)) in the resist pattern thickening material is not particularly limited and can be appropriately set depending on the content and/or type of the resin that contains no cyclic structures, the compound represented by the general formula (1) shown below, a surfactant, etc.

—Compounds Represented by General Formula (1)—

The compound represented by the general formula (1) is not particularly limited as long as it contains an aromatic ring and is represented by the following general formula (1), and can be appropriately selected depending on the intended purpose. Since an aromatic ring is contained, the resulting resist pattern thickening material can be imparted with excellent etching resistance even when the resin fails to contain a cyclic structure.

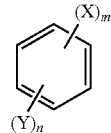

General Formula (1)

where X is a functional group represented by the following structural formula (1), Y is at least one of hydroxyl group, amino group, alkyl group-substituted amino group, alkoxy group, alkoxycarbonyl group and alkyl group, the number of substitution is an integer of 0-3, m is an integer of 1 or greater, and n is an integer of 0 or greater The integer "m" is preferably 1 because easy control of reaction can be achieved by preventing crosslinking reactions.

Structural Formula (1)

where $R^1$ and $R^2$ may be identical or different and each is a hydrogen atom or substituent, Z is at least one of hydroxyl group, amino group, alkyl group-substituted amino group and alkoxy group, and the number of substitution is an integer of 0 to 3

In the structural formula (1) above, $R^1$ and $R^2$ are preferably hydrogen atoms. This is often advantageous in terms of water-solubility.

If $R^1$ and $R^2$ are substituents, such substituents are not particularly limited and can be appropriately determined depending on the intended purpose; examples include ketone (alkylcarbonyl) group, alkoxycarbonyl group and alkyl group.

Specific, preferred examples of the compounds represented by the general formula (1) include compounds having a benzylalcohol structure, and compounds having a benzylamine structure.

The compounds having a benzylalcohol structure are not particularly limited and can be appropriately selected depending on the intended purpose; for example, benzylalcohol and derivatives thereof are preferable. Specific examples include benzyl alcohol, 2-hydroxybenzyl alcohol (salicyl alcohol), 4-hydroxybenzyl alcohol, 2-aminobenzyl alcohol, 4-aminobenzyl alcohol, 2,4-hydroxybenzyl alcohol, 1,4-benzenedimethanol, 1,3-benzenedimethanol, 1-phenyl-1,2-ethanediol, and 4-methoxymethylphenol.

Examples of the compounds having a benzylamine structure are not particularly limited and can be appropriately selected depending on the intended purpose; for example, benzylamine and derivatives thereof are preferable. Specific examples include benzylamine and 2-methoxybenzylamine.

These compounds may be used singly or in combination. Among these, 2-hydroxybenzylalcohol, 4-aminobenzylalcohol and the like are preferable in view of their high water-solubility, which allows the compound to be dissolved in large quantities.

The content of the compound represented by the general formula (1) in the resist pattern thickening material is not particularly limited and can be appropriately set depending on the intended purpose; for example, the content of such a compound is preferably 0.01 parts by mass to 50 parts by mass based on the total amount of the resist pattern thickening material, more preferably, 0.1 parts by mass to 10 parts by mass.

If less than 0.01 parts by mass is used, it may result in failure to obtain a desired degree of reaction, whereas if 50 parts by mass is used, the possibility that the compound is precipitated out of the solution during a coating step and/or pattern defects occur undesirably increases.

—Surfactant—

When it is required, for example, to improve the conformability of a resist pattern thickening material with a resist pattern, to obtain a larger thickening amount of the resist pattern, to improve in-plane uniformity of the thickening effect at the interface between a resist pattern thickening material and a resist pattern, and to provide anti-forming property, the addition of the surfactant can fulfill the requirements.

The surfactant is not particularly limited and may be selected accordingly. Examples thereof include nonionic surfactants, cationic surfactants, anionic surfactants and amphoteric surfactants. These surfactants may be used singly or in combination. Among them, nonionic surfactants are preferred from the viewpoint that they contain no metallic ions such as sodium ion, potassium ion, and the like.

Suitable examples of the nonionic surfactants include alkoxylate surfactants, fatty acid ester surfactants, amide surfactants, alcohol surfactants, and ethylenediamine surfactants. Specific examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid esters, amides, natural alcohols, ethylenediamines, and secondary alcohol ethoxylate compounds.

The cationic surfactants are not particularly limited and can be selected according to the intended purpose. Examples thereof include alkyl cationic surfactants, amide quaternary cationic surfactants and ester quaternary cationic surfactants.

The amphoteric surfactants are not particularly limited and can be selected according to the intended purpose. Examples thereof include amine oxide surfactants and betaine surfactants.

The content of the surfactant in the resist pattern thickening material is not particularly limited and can be appropriately set according to the type, content, etc., of the resin, compound represented by the general formula (1), phase transfer catalyst, etc. A suitable content of the surfactant is, for example, 0.01 parts by mass or more per 100 parts by mass of the resist pattern thickening material, preferably 0.03 parts by mass to 2 parts by mass and, more preferably, 0.05 parts by mass to 0.5 parts by mass in view of a high degree of reaction excellent in-plane uniformity.

When the content of the surfactant is 0.01 parts by mass or less, coating properties will be increased, however, in most cases, the degree of reaction of the resist pattern thickening material with a resist pattern is little different from that of a surfactant-free resist pattern thickening material.

—Phase Transfer Catalyst—

The phase transfer catalyst is not particularly limited and can be selected according to the intended purpose. Examples thereof include organic materials and among them, basic organic materials are particularly preferred.

When the resist pattern thickening material comprises such a phase transfer catalyst, it is advantageous in that the resist pattern is uniformly thickened regardless of its constituent material, which means that thickening properties are less depending on the types of the resist pattern materials. Note that the effect of this phase transfer catalyst will not be impaired by the presence of an acid generation agent in a resist pattern to be thickened by using the resist pattern thickening material.

The phase transfer catalyst is preferably water-soluble, and exhibits water-solubility of at least 0.1 g per 100 g of 25° C. water.

Specific examples of the phase transfer catalyst are crown ethers, azacrown ethers, and onium salt compounds.

The phase transfer catalysts may be used singly or in combination. Among them, onium salt compounds are preferable in view of their high solubility in water.

Examples of crown ether and azacrown ether are 18-crown-6, 15-crown-5,1-aza-18-crown-6, 4,13-diaza-18-crown-6, and 1,4,7-triazacyclononane.

The onium salt compounds are not particularly limited and can be appropriately selected according to the intended purpose; examples include quaternary ammonium salts, pyridinium salts, thiazolium salts, phosphonium salts, piperazinium salts, ephedrinium salts, quininium salts, and cinchoninium salts Examples of the quaternary ammonium salts are those that are often used as organic synthesis reagent: tetrabutylammonium hydrogensulfate, tetramethylammonium acetate, tetramethylammonium chloride, and the like.

Examples of the pyridinium salts include hexadecylpyridinium bromide.

Examples of the thiazolium salts include 3-benxyl-5-(2-hydroxyethyl)-4-methylthiazolium chloride.

Examples of phosphonium salts are tetrabutylphosphonium chloride, and the like.

Examples of the piperazinium salts include 1,1-dimethyl-4-phenylpiperazinium iodide.

Examples of the ephdrinium salts include ((−)-N,N-dimethylephedrinium bromide).

Examples of the quininium salts include N-benzylquininium chloride.

Examples of the cinchoninium salts include N-benxylcinchoninium chloride.

The content of the phase transfer catalyst in the resist pattern thickening material depends on the type, content, etc. of the foregoing resin and the like and thus cannot be defined flatly; however, the content can be set according to such factors. For example, a preferred content range is 10,000 ppm or less, preferably 10 ppm to 10,000 ppm, more preferably 10 ppm to 5,000 ppm and, most preferably, 10 ppm to 3,000.

If the content of the phase transfer catalyst is 10,000 ppm or less, it is advantageous in that the resist pattern, such as line-space patterns, can be thickened regardless of its size.

The content of the phase transfer catalyst can be measured for instance by liquid chromatography.

—Water-Soluble Aromatic Compound—

The water-soluble aromatic compound is not particularly limited, as long as it is an aromatic compound which exhibits water-solubility and can be appropriately selected according to the intended purpose. Water-soluble aromatic compounds with a water-solubility of at least 1 g per 100 g of 25° C. water are preferable, and those with a water-solubility of at least 3 g per 100 g of 25° C. water are more preferable. Particularly, those with a water-solubility of at least 5 g per 100 g of 25° C. water are most preferable.

If the resist pattern thickening material comprises the water-soluble aromatic compound, this is preferable because etching resistance of the obtained resist pattern remarkably increases by virtue of the presence of a cyclic structure of the water-soluble aromatic compound.

Examples of the water-soluble aromatic compound are polyphenol compounds, aromatic carboxylic acid compounds, benzophenone compounds, flavonoid compounds, porphin, water-soluble phenoxy resins, aromatic-containing water-soluble dyes, derivatives thereof and glycosides thereof. These compounds may be used singly or in combination.

Examples of the polyphenol compounds include catechin, anthocyanidin such as pelargonidin-type (4'-hydroxy), cyanidin-type (3',4'-dihydroxy) and delphinidin-type (3',4',5'-trihydroxy), flavan-3,4-diol, proanthocyanidin, resorcine, resorcine[4]arene, pyrogallol and gallic acid.

Examples of the aromatic carboxylic acid compounds include salicylic acid, phthalic acid, dihydroxy benzoic acid and tannin.

Examples of the benzophenone compounds include alizarin yellow A.

Examples of the flavonoid compounds include flavone, isoflavone, flavanol, flavonone, flavonol, flavan-3-ol, aurone, chalcone, dihydrochalcone and quercetin.

These compounds may be used singly or in combination. Among them, polyphenol compounds are preferable, and catechin, resorcine and the like are most preferable.

Among water-soluble aromatic compounds, from the viewpoint of excellent water-solubility, those having two or more polar groups are preferable, those having three or more are more preferable, and those having four or more are most preferable.

The polar group is not particularly limited and cab be appropriately selected depending on the intended purpose; examples include hydroxyl, carboxyl, carbonyl and sulfonyl groups.

The content of the water-soluble aromatic compound in the resist pattern thickening material can be appropriately determined according to the type, content, etc. of the compound represented by the general formula (1), phase transfer catalyst, surfactant, etc.

—Organic Solvent—

The organic solvent is not particularly limited and can be appropriately selected depending on the intended purpose; examples include alcohol organic solvents, linear ester organic solvents, cyclic ester organic solvents, ketone organic solvents, linear ether organic solvents and cyclic ether organic solvents.

If the resist pattern thickening material comprises such an organic solvent, it is advantageous in that the solubility of the compound represented by the general formula (1), the resin, etc., increases in the resist pattern thickening material.

The organic solvent can be mixed with water for use. Suitable examples of water are pure water (deionized water), for example.

Examples of the alcohol organic solvents include methanol, ethanol, propyl alcohol, isopropyl alcohol and butyl alcohol.

Examples of the linear ester organic solvents include ethyl lactate and propylene glycol methyl ether acetate (PGMEA).

Examples of the cyclic ester organic solvents include lactone organic solvents such as γ-butyrolactone.

Examples of the ketone organic solvents include ketone organic solvents such as acetone, cyclohexanone and heptanone.

Examples of the linear ether organic solvents include ethyleneglycol dimethylether.

Examples of the cyclic ether organic solvents include tetrahydrofuran and dioxane.

These organic solvents may be used singly or in combination. Among them, those with a boiling point of about 80° C. to 200° C. are preferable from the viewpoint of precise performance of resist pattern thickening.

The content of the organic solvent in the resist pattern thickening material can be set according to the type, content, etc. of the resin, compound represented by the general formula (1), phase transfer catalyst, surfactant, etc.

—Additional Ingredient—

The additional ingredient is not particularly limited as long as the effect of the present invention is not impaired, and thus can be appropriately selected according to the intended purpose. Examples include various types of known additives such as heat/acid generation agents and quenchers of amine type, amide type, and the like.

The content of the additional ingredient in the resist pattern thickening material can be set according to the type, content, etc. of the resin, compound represented by the general formula (1), phase transfer catalyst, surfactant, etc.

The resist pattern thickening material can be used by applying it over a resist pattern.

Upon application of the resist pattern thickening material, the foregoing surfactant may be applied over the resist pattern before coating the resist pattern with the resist pattern thickening material, rather than applying the surfactant after mixing it with the resist pattern thickening material.

When the resist pattern thickening material is applied over the resist pattern and allowed to interact or mix with it, the resist pattern thickening material undergoes an interaction with the resist pattern to form a mixing layer on the surface of the resist pattern. As a result, the resist pattern is thickened by an amount corresponding to the thickness of the mixing layer, resulting in the formation of a thickened resist pattern.

When a halftone phase shift mask is used as the photomask for the resist pattern formation, it results in printing of side lobes to form unwanted features. Moreover, when a photomask with assist features is used for the resist pattern formation, it results in printing of the assist features to form unwanted features. If these unwanted features are covered with the resist pattern thickening material, the resist pattern thickening material interact with these features to form a mixing layer on their surface, which thickens these features by an amount corresponding to the thickness of the mixing layer and eliminates them.

Even when a work surface has irregularities such as coating irregularities and/or pinholes, the resist pattern is thickened by means of the resist pattern thickening material and thereby these irregularities can be removed from the work surface.

Since the resist pattern thickening material contains a compound represented by the general formula (1) at this point, an excellent and uniform thickening effect can be obtained regardless of the type, size, etc. of the resist pattern material. This means that the amount thickened is less dependent on the type and/or size of the resist pattern material.

As described above, since it is possible to eliminate the unwanted features by applying the resist pattern thickening material over the formed resist pattern, the size of the assist features can be made large, the burden in designing photomasks can be reduced, and assist features can be provided without any hesitation. Thus it is also made possible to increase depth of focus and to achieve easy formation of finer patterns.

In addition, the opening-diameter and/or line-width of a space pattern formed using the thickened resist pattern is smaller than the opening-diameter and/or line-width of the one formed using a resist pattern that is not thickened. In this way a fine space pattern can be provided, exceeding the exposure or resolution limits of the light source of an exposure device used for resist pattern patterning, i.e., the space pattern has an opening-diameter and/or line-width smaller than the minimum possible opening-diameter and/or line-width that can be achieved at the minimum possible wavelength of light applied for the light source. Thus, when the resist pattern, which has been obtained using ArF excimer laser beam, is thickened by means of the resist pattern thickening material and the thickened resist pattern is to be used for the formation of a space pattern, the resultant space pattern has as fine precise lines and/or holes as those obtained by for instance using an electron beam.

The method for applying the resist pattern thickening material is not particularly limited and can be selected from known coating methods depending on the intended use; spin coating is suitably used. For example, the spin coating is performed under the following conditions: rotational speed=about 100 rpm to 10,000 rpm, more preferably 800 rpm to 5,000 rpm; spin time=about 1 second to 10 minutes, more preferably 1 second to 90 seconds.

The thickness of the applied resist pattern thickening material generally ranges from about 100 Å to 10,000 Å (10 nm to 1,000 nm), more preferably ranges from about 1,000 Å to 5,000 Å (100 nm to 500 nm).

Note that in such a coating process the foregoing surfactant may be applied over the resist pattern before coating it with the resist pattern thickening material, rather than applying the surfactant after mixing it with the resist pattern thickening material.

The resist pattern thickening material thus applied is then pre-baked (heated and dried) either during the coating process or after that process, thereby allowing the resist pattern-thickening material to efficiently mix with (or infiltrate) the resist pattern at their interface.

Note that the pre-baking (heating and drying) process and the conditions under which it is performed are not particularly limited unless a resist pattern is softened, and can be appropriately selected depending on the intended use. For example, the pre-baking process may be carried out once, twice, or more times. When the pre-baking process is to be carried out twice or more, the pre-baking temperature may be constant or variable throughout each round of the process. If the pre-baking temperature is constant, the pre-baking temperature is preferably about 40° C. to 150° C., more preferably 70° C. to 120° C., and the pre-baking time is preferably about 10 seconds to 5 minutes, more preferably 40 seconds to 100 seconds.

After the pre-baking (heating and drying) process, it is also preferable to perform a reaction baking process for facilitating the reaction between the applied resist pattern thickening material and the resist pattern. This is because this process can efficiently facilitate the reaction of the mixed (infiltrated) portion occurring at the interface of the resist pattern and the resist pattern thickening material.

Note that the reaction baking (heating and drying) process and the conditions under which it is performed are not particularly limited, and can be appropriately selected depending on the intended use. The baking temperature is, however, higher in this reaction baking process than in the foregoing pre-baking (heating and drying) process. For example, the baking temperature is about 70° C. to 150° C., more preferably 90° C. to 130° C., and the baking time is 10 seconds to 5 minutes, more preferably 40 seconds to 100 seconds.

Moreover, it is preferable to subject the applied resist pattern thickening material to a development process after the reaction baking process. This is because it is possible to form (develop) a thickened resist pattern by dissolving the resist pattern thickening material to remove the portions with no or less interaction with it, i.e., portions with high water solubility. Note that the development process may be performed using either a water developer or an alkali developer.

Note also that the amount of the resist pattern thickened can be controlled to fall within a desired range by appropriately adjusting, for example, the viscosity, coating thickness, baking temperature, baking time of the resist pattern thickening material.

Hereinafter, the process for thickening the resist pattern by means of the resist pattern thickening material will be described with reference to the drawings.

Figure 2:
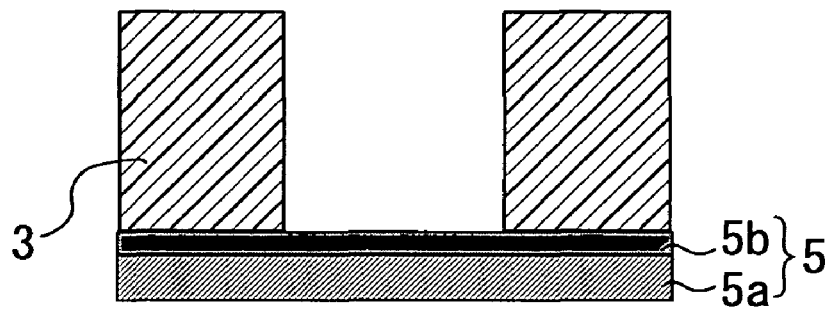
FIG. 2 is a schematic view for explaining a mechanism by which a resist pattern is thickened using a resist pattern thickening material, showing a state where a resist pattern has been formed by patterning of the resist film.
Figure 3:
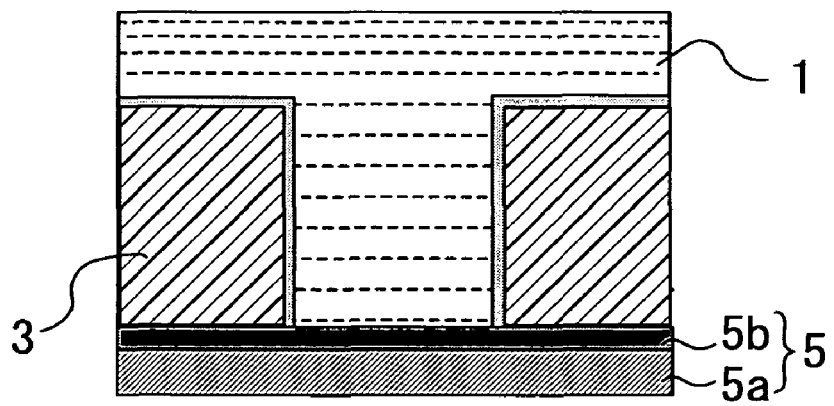
FIG. 3 is a schematic view for explaining a mechanism by which a resist pattern is thickened using a resist pattern thickening material, showing a state where a resist pattern thickening material has been applied over the resist pattern surface.
Figure 4:
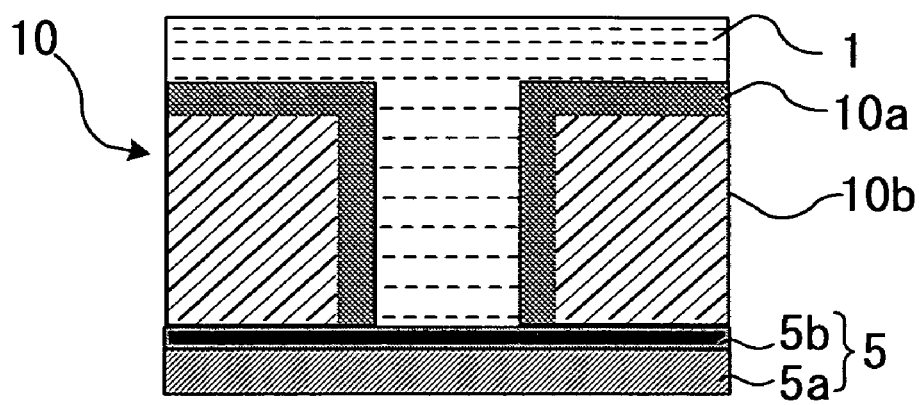
FIG. 4 is a schematic view for explaining a mechanism by which a resist pattern is thickened using a resist pattern thickening material, showing a state where the resist pattern thickening material has been infiltrated into the resist pattern surface.

After applying a resist material over a work surface 5 that is composed of a semiconductor substrate 5a with an antireflection film 5b on its surface for the formation a resist film 3a as shown in FIG. 1, the resist film 3a is patterned and then developed to form a resist pattern 3 as shown in FIG. 2. Subsequently, as shown in FIG. 3, a resist pattern thickening material 1 is provided (applied) over the resist pattern 3 followed by baking (heating and drying) to form coating thereon. At this point, mixing or infiltration of the resist pattern thickening material 1 with or into the resist pattern 3 occurs at the interface between the resist pattern 3 and the resist pattern thickening material 1. As shown in FIG. 4, a reaction then occurs between the mixed (infiltrated) portion of the resist pattern thickening material 1 and the resist pattern 3 at the interface between an inner layer resist pattern 10b (the resist pattern 3) and the resist pattern thickening material 1, resulting in the formation of a surface layer (mixing layer) 10a. Since the resist pattern thickening material 1 contains a compound represented by the general formula (1) at this point, the inner layer resist pattern 10b (the resist pattern 3) is stably and uniformly thickened without being affected by its original size.

Figure 5:
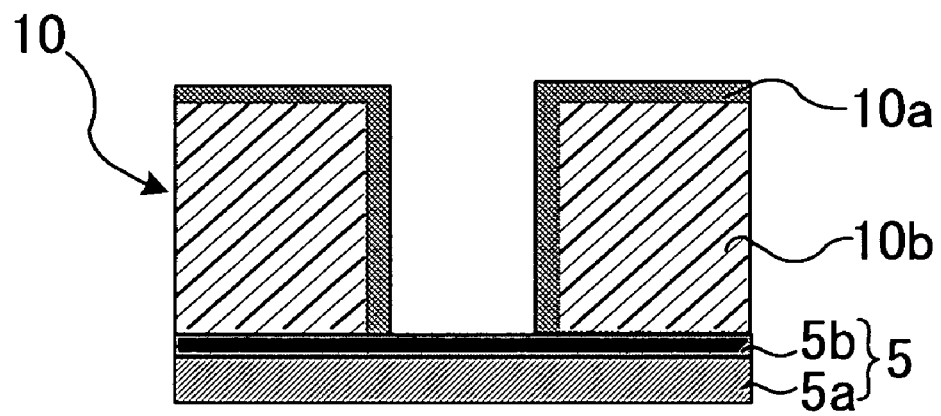
FIG. 5 is a schematic view for explaining a mechanism by which a resist pattern is thickened using a resist pattern thickening material, showing a state where the resist pattern thickening material has been thickened by means of the resist pattern thickening material.

As shown in FIG. 5, development is then conducted to dissolve and remove portions of the resist pattern thickening material 1 that exhibited no or less interaction (mixing) with the resist pattern 3, i.e., portions with high water-solubility. In this way a thickened resist pattern 10 is formed (developed), which is a uniformly thickened resist pattern.

Note that the development process may be performed using either a water developer or an alkali developer.

Even when resist defects (e.g., unwanted features such as side lobes, pinholes, and coating irregularities) were produced upon formation of the resist pattern 3, such resist defects are eliminated by the formation of the surface (mixing) layer 10a over the resist pattern 3 to thicken the resist pattern 3. The formation of unwanted features is therefore allowed, which are of such size that they can be eliminated by means of the resist pattern thickening material 1. It is thus possible to reduce the burden in designing photomasks and to increase depth of focus.

The thickened resist pattern 10 has, on the surface of the inner layer resist pattern 10b (the resist pattern 3), the surface layer (mixing layer) 10a that resulted from the reaction between the resist pattern thickening material 1 and the resist pattern 3. Since the thickened resist pattern 10 is thicker than the resist pattern 3 by an amount corresponding to the thickness of the surface layer (mixing layer) 10a, the size of the space pattern—the distance between adjacent lines of the thickened resist pattern 10 or the opening diameter of the hole pattern formed using the thickened resist pattern 10—is smaller than that of the one formed using the resist pattern 3 that is not thickened. Thus, it is possible to form a fine space pattern, exceeding the exposure or resolution limits of the light source of an exposure device. To be more specific, even when exposure is performed using ArF excimer laser light, the resultant space pattern has as fine precise lines and/or holes as those obtained using, for example, an electron beam. The space pattern formed using the thickened resist pattern 10 has finer, more precise lines and/or holes than does the space pattern formed using the resist pattern 3.

The surface layer (mixing layer) 10a in the thickened resist pattern 10 is made of the resist pattern thickening material 1. The compound represented by the general formula (1) in the resist pattern thickening material 1 contains an aromatic ring. For this reason, even when the resist pattern 3 (inner layer resist pattern 10b) is made of material with poor etching resistance, the resultant thickened resist pattern 10 will have excellent etching resistance. Moreover, when the resist pattern thickening material 1 contains the foregoing cyclic structure such as the foregoing resin a part of which has the foregoing cyclic structure(s), the etching resistance of the surface layer (mixing layer) 10a is further increased.

The thickened resist pattern 10 thus obtained can be used as a mask pattern, reticle pattern, or the like, can be used for example for the manufacture of functional parts such as metallic plugs, interconnections, magnetic heads, liquid crystal displays (LCDs), plasma display panels (PDPs) and surface acoustic wave filters (SAW filters); optical parts for optical interconnection; fine parts such as microactuators; and semiconductor devices, and can be employed most preferably in the method of the present invention for manufacturing a semiconductor device.

For example, even when the foregoing resist pattern thickening material is alkalified (pH≧10) before use by the addition of an alkaline substance or when the foregoing resist pattern thickening material is to be used for a resist pattern that has been left outside the clean room in a normal atmosphere for 1 year after its exposure, the amount of thickening of the resist pattern is as great as it is for normal case. In addition, even when the foregoing resist pattern thickening pattern is used for a resist pattern formed of a non-chemically amplified resist that is made for instance of polymethylmethacrylate and is free from an acid or acid generation agent, the resist pattern exhibits thickening to the same extend as a resist pattern formed of a chemically amplified resist. It can be readily learned from these facts that the present invention employs a different reaction mode than the invention disclosed in JP-A No. 2001-5197 where a reaction layer is formed by means of crosslinking reaction using an acid.

<Patterning Step>

The patterning step is a step in which the work surface is patterned by etching using the thickened resist pattern formed in the resist pattern forming step as a mask or the like (i.e., as a mask pattern or the like).

The etching method is not particularly limited and can be appropriately selected from known methods depending on the intended use; dry etching is a suitable example. The etching conditions are not particularly limited and can be set depending on the intended purpose.

Suitable examples of the additional step include a surfactant application step.

The surfactant application step is a step for applying the surfactant on the surface of the resist pattern prior to the resist pattern forming step.

The surfactant is not particularly limited and can be appropriately selected depending on the intended use; suitable examples thereof include the surfactants listed above, such as polyoxyethylene-polyoxypropylene condensation products, polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, natural alcohols, ethylene diamines, secondary alcohol ethoxylates, alkyl cations, amide quaternary cations, ester quaternary cations, amine oxides and betaines.

With the method of the present invention for manufacturing a semiconductor device, it is possible to efficiently manufacture various types of semiconductor devices including FLASH memories, DRAMs, and FRAMs.

Hereinafter, the present invention will be described with reference to Examples, which however shall not be construed as limiting the invention thereto. Note also in Examples that "part(s)" means "part(s) by mass" unless otherwise indicated.

EXAMPLE 1

<Thickened Resist Pattern Formation Example 1>

Using a halftone phase shift mask as a photomask, a resist pattern was formed and thickened in the manner described below.

Figure 6A:
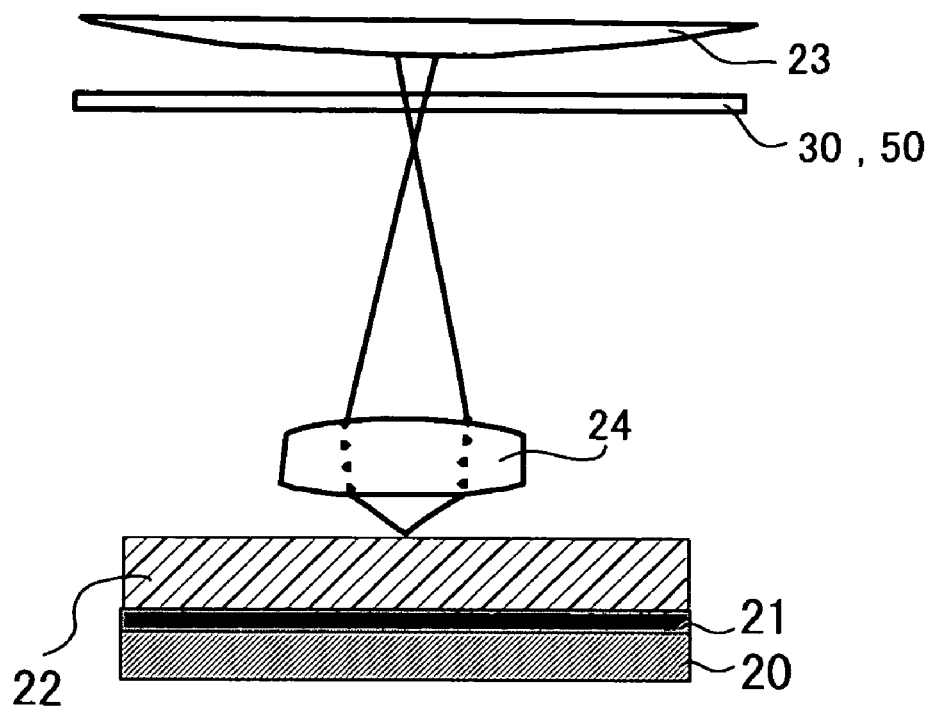
FIG. 6A is a process view of an example of the method of the present invention for manufacturing a semiconductor device, showing a state where a work surface has been coated with a resist material and exposed to light.
Figure 6B:
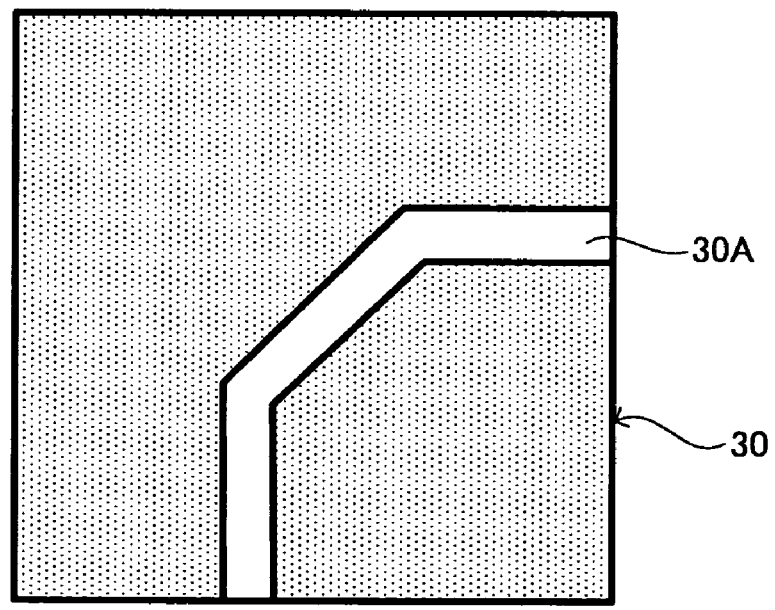
FIG. 6B is a top view of an example of a halftone phase shift mask (reticle) used for exposure.
Figure 6C:
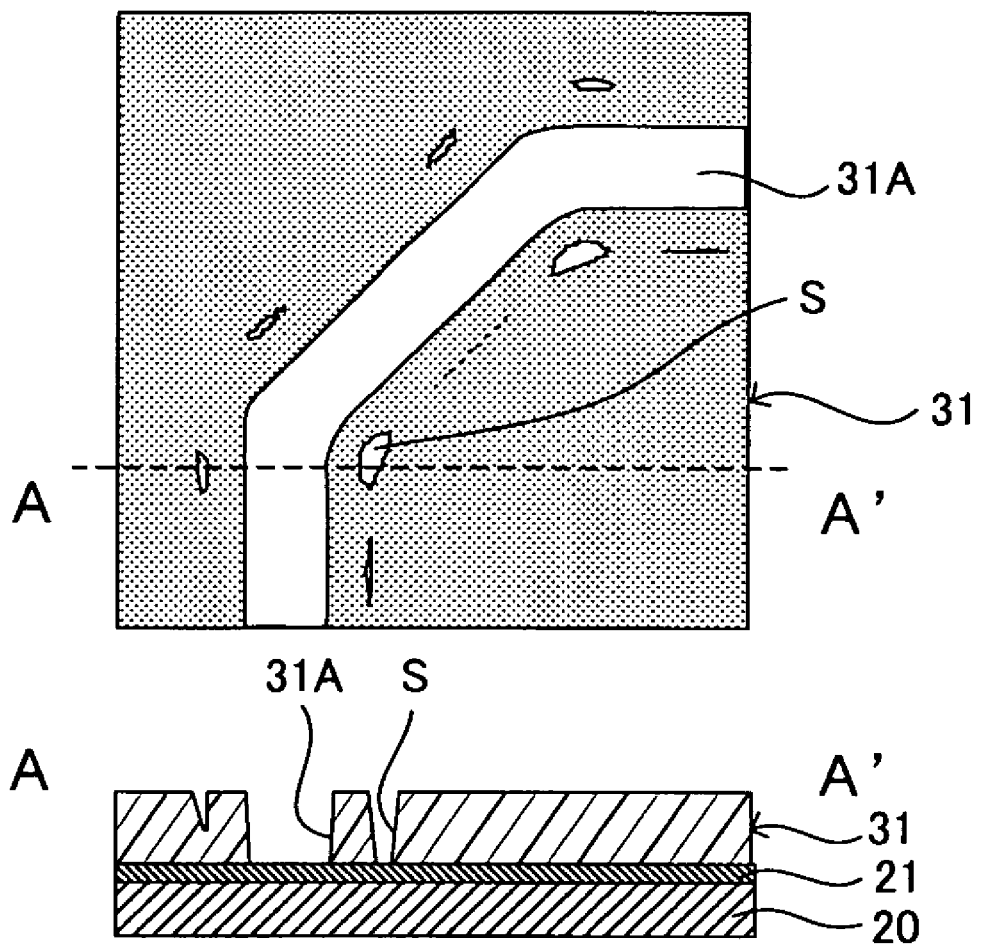
FIG. 6C is a process view of an example of the method of the present invention for manufacturing a semiconductor device, showing a state where a resist pattern has been formed.

As shown in FIG. 6A, an antireflection film 21 formed of a metal thin film was formed on a semiconductor substrate 20, and an ArF resist 22 ("ARF1244J" made by JSR) was applied over the antireflection film 21, or a work surface. As shown in FIG. 6B, a halftone phase shift mask (reticle) 30 with a seal ring pattern 30A (design pattern) was then irradiated with light (ArF excimer laser light) 23, and the light passing through the reticle 30 was collected by a projection lens 24, exposing the ArF resist 22 followed by development. In this way a seal ring resist pattern—a ¼ scale image of the sealing pattern 30A in the reticle 30—was printed on the ArF resist 22. The resultant resist pattern 31 is shown in FIG. 6C. As shown in FIG. 6C, side lobes S were formed in areas other than the primary feature 31A.

—Preparation of Resist Pattern Thickening Material—

A resist pattern thickening material containing the following ingredients was prepared:

Polyvinyl acetal resin as the foregoing resin ("KW-3" made by Sekisui Chemical Co., Ltd.). 16 Parts 2-Hydroxybenzyl alcohol as the compound represented by the following general formula (1) . . . 1.35 Parts Purified water . . . 98.6 Parts Isopropyl alcohol as the foregoing organic solvent . . . 0.4 Parts Nonionic surfactant (polyphenol surfactant made by ADEKA Corporation) . . . 0.25 Parts

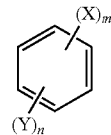

General Formula (1)

where X is a functional group represented by the following structural formula (1), Y is at least one of hydroxyl group, amino group, alkyl group-substituted amino group, alkoxy group, alkoxycarbonyl group and alkyl group, the number of substitution is an integer of 0 to 3, m is an integer of 1 or greater, and n is an integer of 0 or greater Structural Formula (1)

where $R^1$ and $R^2$ may be identical or different and each is a hydrogen atom or substituent, Z is at least one of hydroxyl group, amino group, alkyl group-substituted amino group and alkoxy group, and the number of substitution is an integer of 0 to 3

Figure 6D:
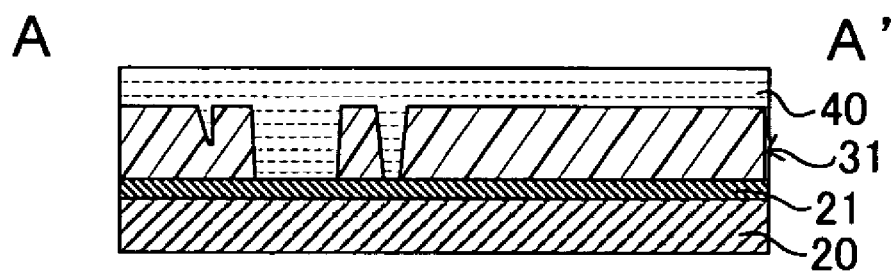
FIG. 6D is a process view of an example of the method of the present invention for manufacturing a semiconductor device, showing a state where a resist pattern thickening material has been applied over the resist pattern.

As shown in FIG. 6D, the resist pattern thickening material 40 prepared above was applied over the seal ring resist pattern 31 having the primary feature 31A and side lobes S by means of spin coating at 1,000 rpm for 5 seconds and then at 3,500 rpm for 40 seconds, followed by baking at 110° C. for 60 seconds. Thereafter, the resist pattern thickening material 40 was rinsed with purified water for 60 seconds to remove non-reacted (non-interacted or non-mixed) portions, revealing a resist pattern thickened by means of the resist pattern thickening material 40. In this way a thickened resist pattern 41 was formed. The thickened resist pattern 41 is shown in FIG. 6E.

Figure 6E:
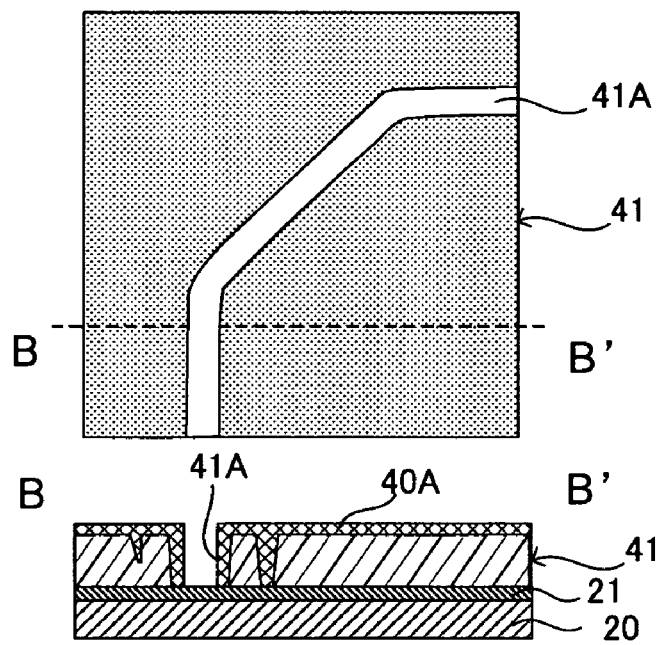
FIG. 6E is a process view of an example of the method of the present invention for manufacturing a semiconductor device, showing a state where the resist pattern has been thickened by means of the resist pattern thickening material and thereby unwanted feature have been eliminated.

It can be learned from FIG. 6E that a mixing layer 40A was formed inside the side lobes S present in areas other than the primary feature 31A and thereby the side lobes S were eliminated, suggesting that potential etching failures due to the presence of such side lobes S can be avoided in the subsequent etching step upon manufacture of a semiconductor device.

While the size of the initial pattern (primary feature) 31A (see FIG. 6C), i.e., the size of the resist space pattern formed by the resist pattern before thickened is 110 nm in width, the size of the resist space pattern 41A (see FIG. 6E) formed by the thickened resist pattern, i.e., the size of the resist space pattern after thickening was 100 nm in width. Thus it was established that the resist pattern thickening material 40 coating can reduce the width of the primary feature 31A in the seal ring pattern.

<Thickened Resist Pattern Formation Example 2>

A resist pattern was formed and thickened in the same manner as that in Thickened Resist Pattern Formation Example 1 except that, instead of the halftone phase shift mask, a photomask having a design pattern (feature) and SRAFs around the design pattern was used for increased depth of focus.

Figure 7A:
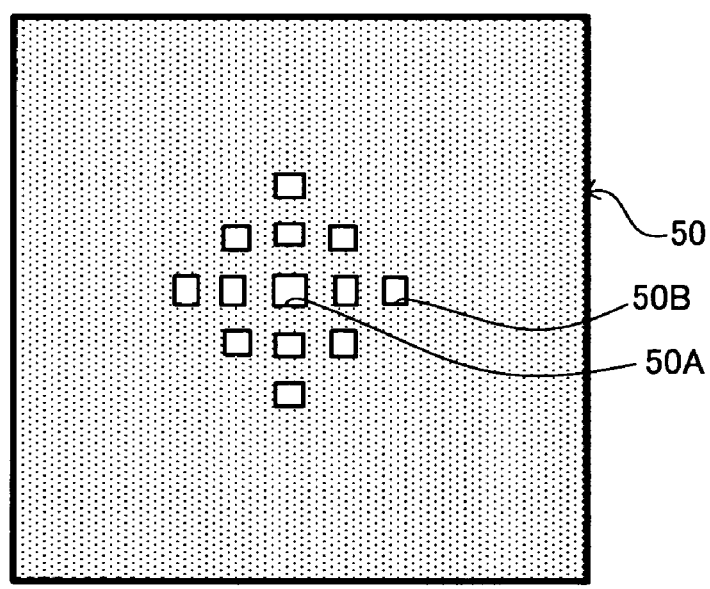
FIG. 7A is a top view of an example of a reticle where assist features are arranged around a design pattern, which the reticile is used in the exposure step in the method of the present invention for manufacturing a semiconductor.

As shown in FIG. 6A, an antireflection film 21 formed of a metal thin film was formed on a semiconductor substrate 20, and an ArF resist 22 ("ARF1244J" made by JSR) was applied over the antireflection film 21. As shown in FIG. 7A, a reticle 50 with a design pattern 50A (primary feature: hole pattern) and assist features 50B arranged around the design pattern (feature) 50A was then irradiated with light (ArF excimer laser) 23, and the light passing through the reticle 50 was collected by the projection lens 24, exposing the ArF resist 22 followed by development. In this way a resist pattern (hole pattern)—a ¼ scale image of the design pattern 50A in the reticle 50—was printed on the ArF resist 22. The size of the design pattern 50A was about 140 nm, and the size of the assist features 50B was about 100 nm.

Figure 7B:
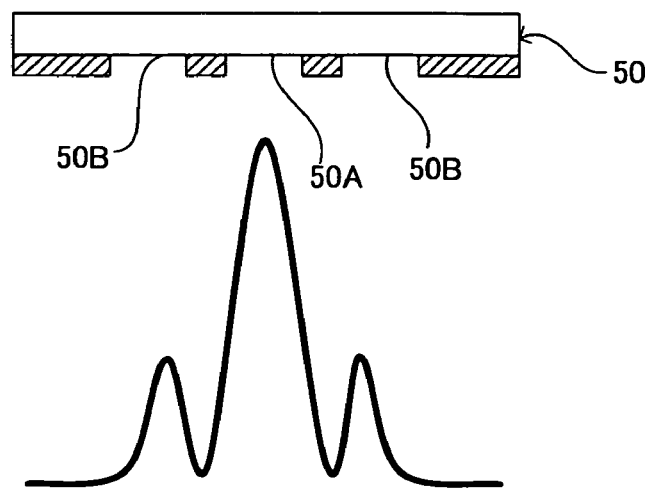
FIG. 7B is a schematic diagram of an example of a light intensity distribution obtained when the reticle shown in FIG. 7A is used.
Figure 7C:
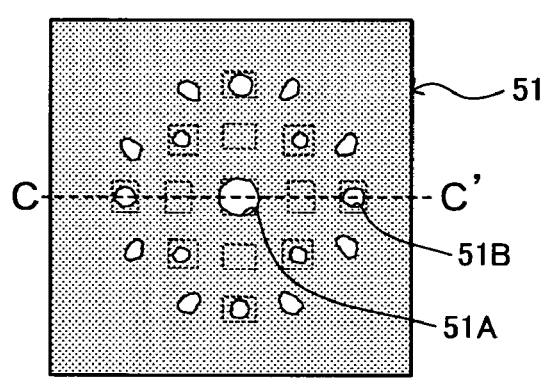
FIG. 7C is a process view of an example of the method of the present invention for manufacturing a semiconductor device, showing a state where a resist pattern has been formed.
Figure 7C:
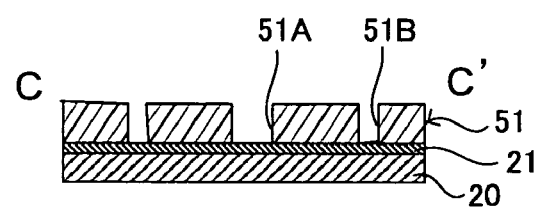

A light intensity distribution obtained with the reticle 50 is shown in FIG. 7B. In this light intensity distribution, as shown in FIG. 7B, there are peaks at either side of the primary feature 50A, which correspond to the assist features 50B. For this reason, as shown in FIG. 7C, assist features 51B were undesirably printed on areas around a primary feature 51B in the resultant resist pattern 51. The size of the printed assist features 51B was about 50 nm, and depth of focus was about 240 nm provided that depth of focus is defined as the distance within which the obtained pattern size is within ±10% of the intended size. Note that the upper limit of the assist feature size, below which the assist features 50B never print, is 105 nm, and depth of focus is about 200 nm.

Figure 7D:
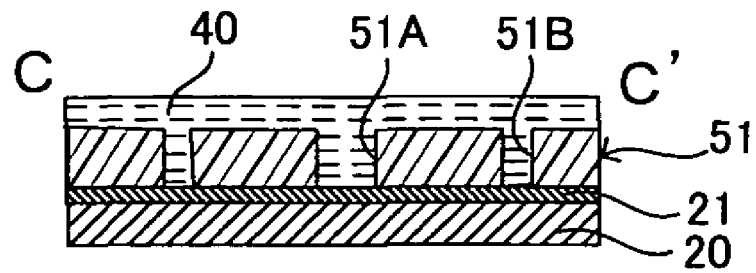
FIG. 7D is a process view of an example of the method of the present invention for manufacturing a semiconductor device, showing a state where a resist pattern thickening material has been applied over the resist pattern.

As shown in FIG. 7D, the resist pattern thickening material 40 prepared in Thickened Resist Pattern Formation Example 1 was applied over the resist pattern 51 that includes the primary feature 51A and printed assist features 51B, by means of spin coating at 1,000 rpm for 5 seconds and then at 3,500 rpm for 40 seconds, followed by baking at 110° C. for 60 seconds. Thereafter, the resist pattern thickening material 40 was rinsed with purified water for 60 seconds to remove non-reacted (non-interacted or non-mixed) portions, revealing a resist pattern thickened by means of the resist pattern thickening material 40. In this way a thickened resist pattern 42 was formed. The thickened resist pattern 42 is shown in FIG. 7E.

Figure 7E:
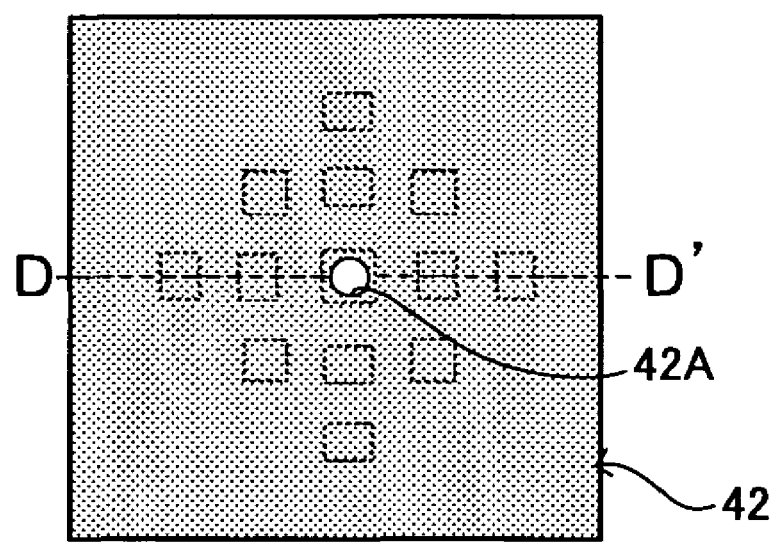
FIG. 7E is a process view of an example of the method of the present invention for manufacturing a semiconductor device, showing a state where the resist pattern has been thickened and thereby unwanted features have been eliminated.
Figure 7E:
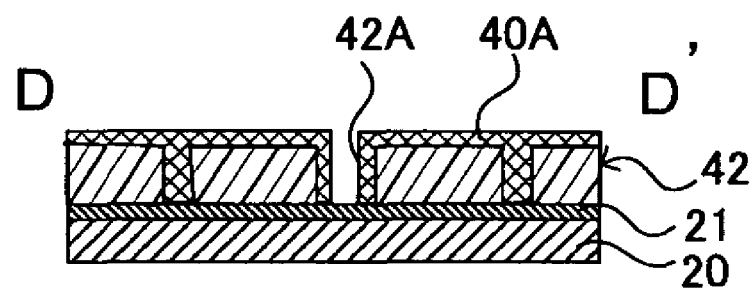

It can be learned from FIG. 7E that a mixing layer 40A was formed inside the printed assist features 51B present in areas other than the primary feature 51A and thereby the assist features 51B were eliminated, suggesting that potential etching failures due to the presence of such printed assist features can be avoided in the subsequent etching step upon manufacture of a semiconductor device.

In the case of using photomasks with assist features, it has been required in the prior art to design a photomask so that their assist features never undergo printing, but the resist pattern thickening material allows use of photomasks with larger assist features without any hesitation, thereby making it possible to reduce the burden in designing photomasks and to increase depth of focus for improved exposure process margin.

While the size of the initial pattern (primary feature) 51A (see FIG. 7C), i.e., the size of the resist space pattern formed by the resist pattern before thickened is 110 nm in diameter, the size of the resist space pattern 51A (see FIG. 7E) formed by the thickened resist pattern, i.e., the size of the resist space pattern after thickening was 100 nm in diameter. Thus it was established that the resist pattern thickening material 40 coating can reduce the diameter of the primary feature 51A of the resist pattern 51.

Figure 8A:
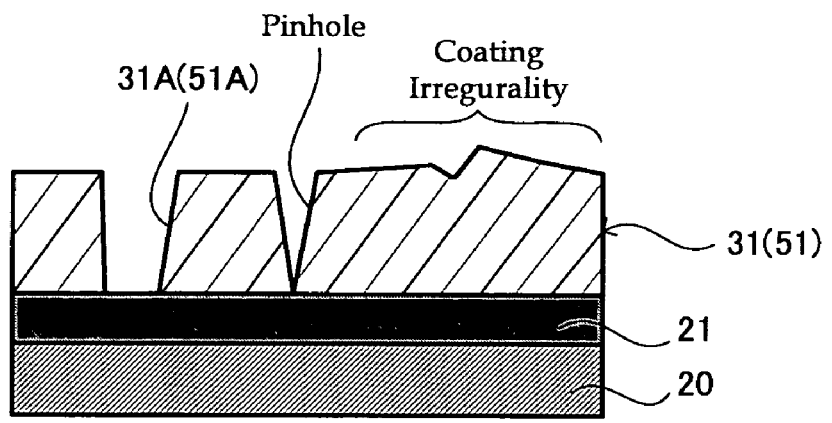
FIG. 8A is a schematic explanatory view of an example of a resist pattern with pinholes and coating irregularities on the surface.
Figure 8B:
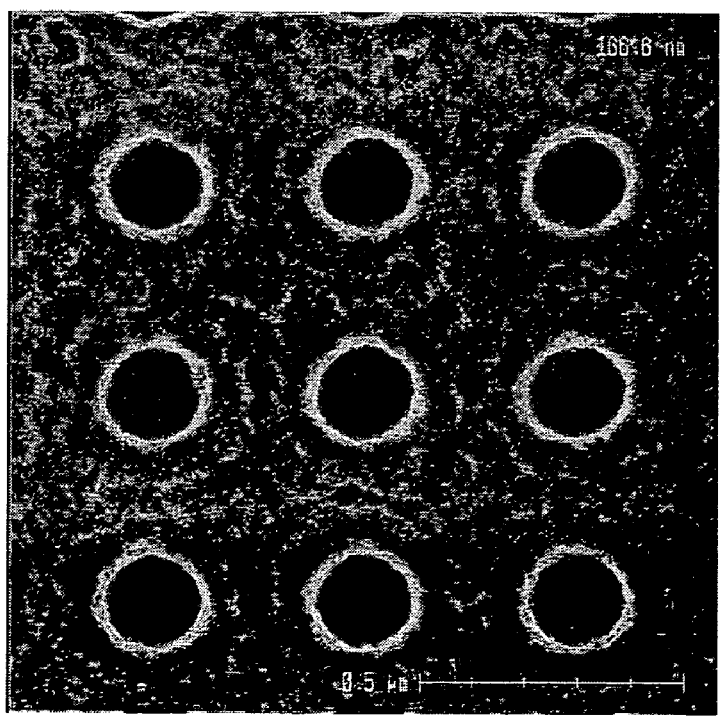
FIG. 8B is a picture of the resist pattern surface with pinholes and coating irregularities.
Figure 8C:
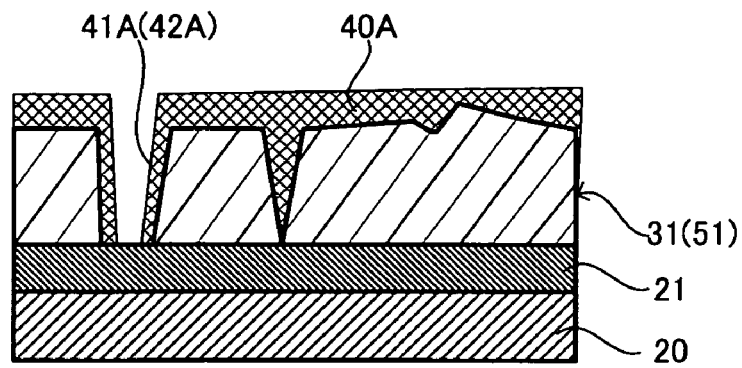
FIG. 8C is a schematic explanatory view showing a state where the resist pattern surface with pinholes and coating irregularities has been thickened by means of a resist pattern thickening material.
Figure 8D:
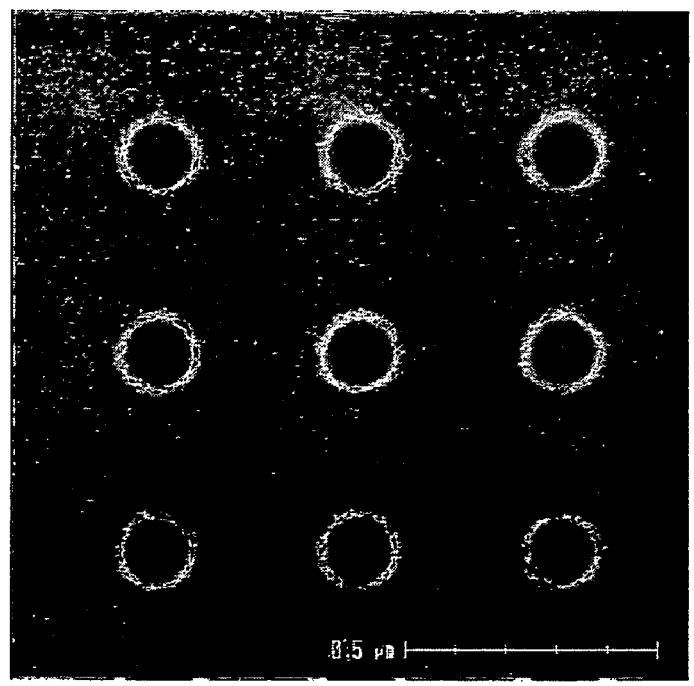
FIG. 8D is a picture of the resist pattern surface with pinholes and coating irregularities which has been thickened by means of a resist pattern thickening material.

As shown in the drawing of FIG. 8A and the picture of FIG. 8B, in Thickened Resist Pattern Formation Examples 1 and 2, resist defects (e.g., coating irregularities and pinholes) were observed on areas other than the primary features (design patterns) of the resist patterns 31 and 51 that had been obtained by coating of the antireflection film 21 with the ArF resist 22 followed by exposure and development. As shown in the drawing of FIG. 8C and the picture of FIG. 8D, however, the resist pattern thickening material 40 coating eliminated resist pattern surface unevenness caused due to coating irregularities, and pinholes were filled with the resist pattern thickening material and thus were eliminated.

—Manufacture of Semiconductor Device—

Figure 9A:
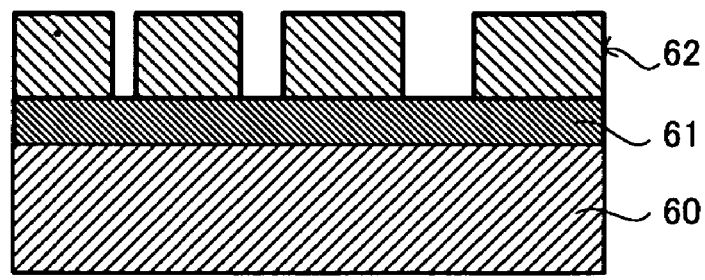
FIG. 9A is a process view of an example of the method of the present invention for manufacturing a semiconductor device, showing a state where a thickened resist pattern has been formed.
Figure 9B:
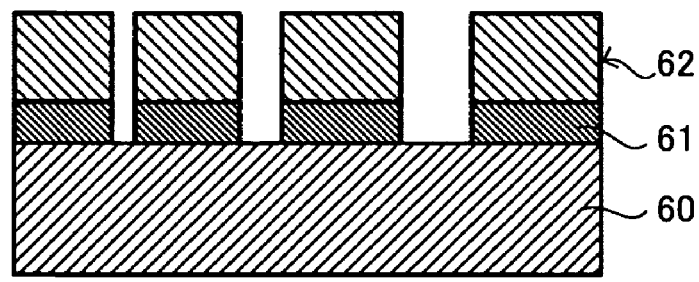
FIG. 9B is a process view of an example of the method of the present invention for manufacturing a semiconductor device, showing a state where some areas of the metal layer have been etched away using the thickened resist pattern as a mask.
Figure 9C:
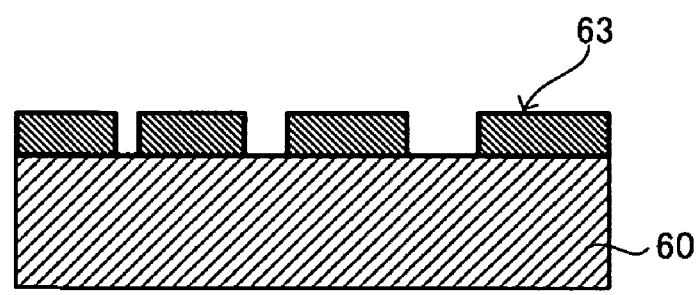
FIG. 9C is a process view of an example of the method of the present invention for manufacturing a semiconductor device, showing a state where a metal interconnection pattern has been formed on a semiconductor substrate.
Figure 10:
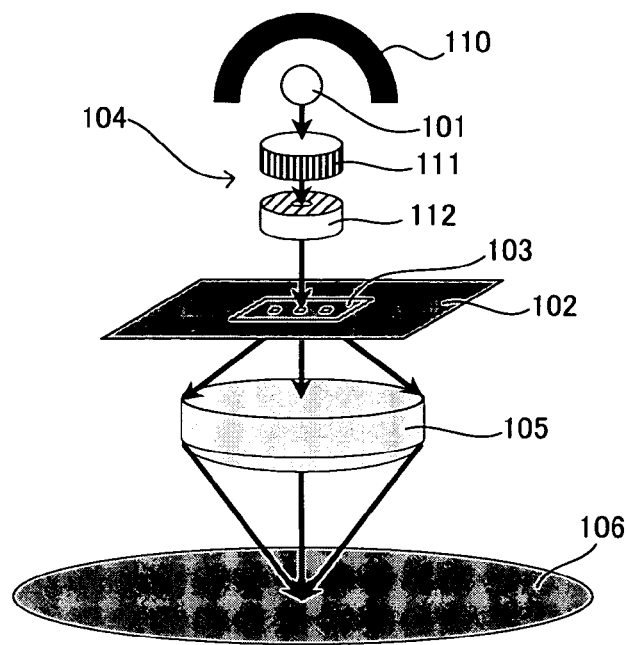
FIG. 10 is a schematic explanatory view of an example of a reduction projection exposure device.

After forming an intermediate layer 61 that is formed of a metal film made for instance of SiOC on a semiconductor substrate 60, an ArF resist was applied over the intermediate layer 61, and a thickened resist pattern 62 was formed in the same manner as those prepared in Thickened Resist Pattern Formation Examples 1 and 2. Subsequently, as shown in FIG. 9B, anisotropic etching was conducted to pattern the intermediate layer 61 while using the resultant thickened resist pattern 62 as a mask. After removal of the thickened resist pattern 62, a metal interconnection pattern 63 was formed on the semiconductor substrate 60 as shown in FIG. 9C. In this way a semiconductor device with the metal interconnection pattern 63 was manufactured.

It is therefore possible to increase depth of focus, to achieve formation of resist patterns that provide large exposure process margin, and to achieve efficient mass production of high-performance semiconductor devices.

The method of the present invention for manufacturing a semiconductor device is capable efficient mass production of high-performance semiconductor devices while reducing the burden in designing photomasks and increasing depth of focus, and is suitably used for the manufacture of various semiconductor devices including FLASH memories, DRAMS, and FRAMs.

According to the present invention, it is possible to solve the foregoing conventional problems and to provide a method for manufacturing a semiconductor device, which the method is capable of efficient mass production of high-performance semiconductor devices by, upon manufacture of a semiconductor device, eliminating unwanted features (e.g., side lobes) created together with a resist pattern by thickening the resist pattern, to reduce the burden in designing photomasks and to increase depth of focus.

What is claimed is:

1. A method for manufacturing a semiconductor device, comprising:

forming a first film, forming a resist film over the first film;

exposing the resist film using any one of a halftone phase shift mask and a photomask having an assist pattern;

forming a resist pattern on the first film, wherein the resist pattern comprises a design pattern and an unwanted pattern; and forming a resist pattern thickening material over the resist pattern, performing a thickening process to fill the unwanted pattern while the design pattern remains, and patterning the first film by etching using the resist pattern thickened as a mask, wherein the unwanted pattern is any one of a side lobe and an assist feature, the side lobe is printed from the halftone phase shift mask to the resist film, and the assist feature is formed around the design pattern in exposing by using the photomask having an assist pattern, wherein an aspect ratio of the unwanted pattern is greater than an aspect ratio of the design pattern, where the aspect ratio of the unwanted pattern and the design pattern is a ratio of a depth to a width of the unwanted pattern and the design pattern, respectively, wherein the resist pattern thickening material contains at least a resin and a compound represented by the following general formula (1) to thereby thicken the resist pattern:

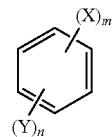

General Formula (1)

where X is a functional group represented by the following structural formula (1), Y is at least one of hydroxyl group, amino group, alkyl group-substituted amino group, alkoxy group, alkoxycarbonyl group and alkyl group, the number of substitution is an integer of 0 to 3, m is an integer of 1 or greater, and n is an integer of 0 or greater,

Structural Formula (1)

where $R^1$ and $R^2$ may be identical or different and each is a hydrogen atom or substituent, Z is at least one of hydroxyl group, amino group, alkyl group-substituted amino group and alkoxy group, and the number of substitution is an integer of 0 to 3.

2. The method for manufacturing a semiconductor device according to claim 1, wherein the formation of the resist pattern is conducted by applying a resist material over the first film, exposing the resist material using a photomask, and developing the resist material.

3. The method for manufacturing a semiconductor device according to claim 1, wherein the side lobe is of such width that the side lobe is eliminated by means of the resist pattern thickening material.

4. The method for manufacturing a semiconductor device according to claim 1, wherein the unwanted pattern is formed by using the photomask having an assist pattern of such width that a printed unwanted pattern can be eliminated by means of the resist pattern thickening material.

5. The method for manufacturing a semiconductor device according to claim 1, wherein the first film is a surface of a semiconductor substrate.

6. The method for manufacturing a semiconductor device according to claim 1, wherein the resist pattern is formed of at least one of an ArF resist and an acrylic resin-containing resist.

7. The method for manufacturing a semiconductor device according to claim 6, wherein the ArF resist is at least one resist selected from the group consisting of an acrylic resist having an alicyclic functional group in its side chain, a cycloolefin-maleic acid anhydrate (COMA) resist, and a cycloolefin resist.

8. The method for manufacturing a semiconductor device according to claim 1, wherein the resist pattern thickening material is either water-soluble or alkali-soluble.

9. The method for manufacturing a semiconductor device according to claim 1, wherein "m" in the general formula (1) is 1.

10. The method for manufacturing a semiconductor device according to claim 1, wherein the content of the compound represented by the general formula (1) in the resist pattern thickening material is 0.01 parts by mass to 50 parts by mass based on the total amount of the resist pattern thickening material.

11. The method for manufacturing a semiconductor device according to claim 1, wherein the resin is at least one selected from the group consisting of polyvinyl alcohol, polyvinyl acetal, and polyvinyl acetate.

12. The method for manufacturing a semiconductor device according to claim 1, wherein the resist pattern thickening material contains a surfactant.

13. The method for manufacturing a semiconductor device according to claim 1, wherein application of the resist pattern thickening material is conducted followed by development of the resist pattern thickening material.

14. The method for manufacturing a semiconductor device according to claim 13, wherein the development is conducted using at least water.

15. The method for manufacturing a semiconductor device according to claim 1, wherein the exposure of the resist film is any one of reduction projection exposure and immersion exposure.

* * * * *